US007013439B2

(12) United States Patent
Robles et al.

(10) Patent No.: US 7,013,439 B2
(45) Date of Patent: Mar. 14, 2006

(54) CONTRAST BASED RESOLUTION ENHANCING TECHNOLOGY

(76) Inventors: Juan Andres Torres Robles, 29499 SW. Meadows Loop, #269, Wilsonville, OR (US) 97070; Yuri Granik, 554 Driscoll Pl., Palo Alto, CA (US) 94306

( * ) Notice: Subject to any disclaimer, the term of this patent is extended or adjusted under 35 U.S.C. 154(b) by 145 days.

(21) Appl. No.: 10/356,382

(22) Filed: Jan. 31, 2003

(65) Prior Publication Data

US 2004/0005089 A1   Jan. 8, 2004

Related U.S. Application Data

(60) Provisional application No. 60/354,042, filed on Jan. 31, 2002, provisional application No. 60/360,692, filed on Feb. 28, 2002.

(51) Int. Cl.
*G06F 17/50* (2006.01)
(52) U.S. Cl. .............................. 716/4; 716/19
(58) Field of Classification Search ................ 716/4–5, 716/19–21
See application file for complete search history.

(56) References Cited

U.S. PATENT DOCUMENTS

| | | |
|---|---|---|
| 4,762,396 A | 8/1988 | Dumant et al. |
| 5,502,654 A | 3/1996 | Sawahata |
| 5,655,110 A | 8/1997 | Krivokapic et al. |
| 5,723,233 A | 3/1998 | Garza et al. |
| 5,825,647 A | 10/1998 | Tsudaka |
| 5,879,844 A | 3/1999 | Yamamoto et al. |
| 6,016,357 A | 1/2000 | Neary et al. |
| 6,049,660 A | 4/2000 | Ahn et al. |
| 6,077,310 A | 6/2000 | Yamamoto et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |
| 6,263,299 B1 | 7/2001 | Aleshin et al. |
| 6,269,472 B1 | 7/2001 | Garza et al. |
| 6,301,697 B1 | 10/2001 | Cobb |
| 6,370,679 B1 | 4/2002 | Chang et al. |
| 6,425,117 B1 | 7/2002 | Pasch et al. |
| 6,453,452 B1 | 9/2002 | Chang et al. |
| 6,453,457 B1 | 9/2002 | Pierrat et al. |
| 6,467,076 B1 | 10/2002 | Cobb |

(Continued)

FOREIGN PATENT DOCUMENTS

JP   09319067 A   12/1997

(Continued)

OTHER PUBLICATIONS

Cobb, N., and Y. Granik, "Model-Based OPC Using the MEEF Matrix," *Proceedings of SPIE, vol. 4889: 22nd Annual BACUS Symposium on Photomask Technology*, Monterey, Calif., Sep. 30-Oct. 4, 2002, p. 147.

(Continued)

Primary Examiner—Leigh M. Garbowski
(74) Attorney, Agent, or Firm—Christensen O'Connor Johnson Kindness PLLC

(57) ABSTRACT

A contrast-base resolution enhancing technology (RET) receives an indication of an edge fragment in a photolithographic design. The edge fragment has a tag classification that defines a contrast of the edge fragment. The contrast-based RET applies a resolution enhancement to the edge fragment based on the tag classification. The resolution enhancement introduces an additional feature in the photolithographic design. The additional feature changes the contrast of the edge fragment.

21 Claims, 28 Drawing Sheets

U.S. PATENT DOCUMENTS 6,499,003 B1    12/2002    Jones et al.
6,601,231 B1 *    7/2003    LaCour ........................ 716/21

FOREIGN PATENT DOCUMENTS

WO      WO 01/65315 A2    9/2001

OTHER PUBLICATIONS

Cobb, N., and A. Zakhor, "Experimental Results on Optical Proximity Correction With Variable Threshold Resist Model," *Proceedings of SPIE, vol. 3051: Symposium on Optical Microlithography X*, Santa Clara, Calif., Mar. 10-14, 1997, pp. 458-468.

Cobb, N. and A. Zakhor, "Fast, Low-Complexity Mask Design," *Proceedings of SPIE, vol. 2440: Symposium on Optical/Laser Microlithography VIII*, Santa Clara, Calif., Feb. 22-24, 1995, pp. 313-327.

Cobb, N., and A. Zakhor, "Fast Sparse Aerial Image Calculation for OPC," *Proceedings of SPIE, vol. 2621: 15th Annual BACUS Symposium on Photomask Technology and Management*, Santa Clara, Calif., Sep. 20-22, 1995, pp. 534-545.

Cobb, N., and A. Zakhor, "Large Area Phase-Shift Mask Design," *Proceedings of SPIE, vol. 2197: Symposium on Optical/Laser Microlithography VII*, San Jose, Calif., Mar. 2-4, 1994, pp. 348-360.

Cobb., N., et al., "Mathematical and CAD Framework and Proximity Correction," *Proceedings of SPIE, vol. 2726: Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (Nov. 20, 2002), *Proceedings of SPIE, vol. 5130: Photomask Japan*, Yokohama, Japan, Apr. 16-18, 2003, p. 42.

Granik, Y., "Generalized MEEF Theory," *Interface 2001*, Nov. 2001.

Granik, Y., and N. Cobb, "MEEF as a Matrix," *Proceedings of SPIE, vol. 4562: 21st Annual BACUS Symposium on Photomask Technology*, Monterey, Calif., Oct. 2-5, 2001, pp. 980-991.

Granik, Y., and N. Cobb, "Two-Dimensional G-MEEF Theory and Applications," *Proceedings of SPIE, vol. 4754: Symposium on Photomask and Next-Generation Lithography Mask Technology IX*, Yokohama, Japan, Apr. 23-25, 2002, pp. 146-155.

Maurer, W., et al., "Process Proximity Correction Using an Automated Software Tool," *Proceedings of SPIE, vol. 3334: Optical Microlithography XI*, Santa Clara, Calif., Feb. 22-27, 1998, pp. 245-253.

Maurer, W., et al., "Evaluation of a Fast and Flexible OPC Package: OPTISSIMO," *Proceedings of SPIE, vol. 2884: 16th Annual Symposium on Photomask Technology and Management*, Redwood City, Calif., Sep. 18-20, 1996, pp. 412-418.

Ohnuma, H., et al., "Lithography Computer Aided Design Technology for Embedded Memory in Logic," *Japanese Journal of Applied Physics* 37(12b):6686-6688, Dec. 1998.

* cited by examiner

CONTRAST BASED RESOLUTION ENHANCING TECHNOLOGY

RELATED APPLICATIONS

This application claims priority to U.S. Provisional Application No. 60/354,042, entitled "Contrast-Based Assist Feature Optimization," filed on Jan. 31, 2002, which is hereby fully incorporated by reference, and to U.S. Provisional Application No. 60/360,692, entitled "Contrast-Based RET," filed on Feb. 28, 2002, which is hereby fully incorporated by reference.

FIELD OF THE INVENTION

The present invention pertains to the field of Resolution Enhancing Technologies (RET) in photolithography. More particularly, this invention relates to using contrast measurements to improve the resolution of features.

BACKGROUND OF THE INVENTION

In photolithography, a design is transferred onto a surface by shining a light through a mask (or reticle) of the design onto a photosensitive material covering the surface. The light exposes the photo-sensitive material in the pattern of the mask. A chemical process etches away either the exposed material or the unexposed material, depending on the particular process that is being used. Another chemical process etches into the surface wherever the photosensitive material was removed. The result is the design itself, either imprinted into the surface where the surface has been etched away, or protruding slightly from the surface as a result of the surrounding material having been etched away.

Photolithography is used for a variety of purposes, such as manufacturing micro-mechanical devices and integrated circuits (ICs). For ICs, a silicon wafer goes through several iterations of imprinting a design on the wafer, growing a new layer over the previously imprinted design, and imprinting another design on the new layer. The different designs on each layer interact electrically to form circuit components, such as transistors, transmission paths, and input/output pads.

Photolithography can make very small components. Huge numbers of small circuit components can fit within a given surface area. Current photolithography techniques routinely fit millions of circuit components onto a single chip. Market pressures, however, continually drive for smaller components, higher density, and greater functionality.

FIG. 1 illustrates one embodiment of a cross-sectional intensity profile 110 of light 120 projecting a feature 130 onto a surface 140 in a photolithographic process. The surface is covered with a photosensitive material. A certain intensity of light, dose 150, is needed to expose the photo-sensitive material. Below dose 150, the material is not adequately exposed to create an image. In which case, the edges 160 of the feature 130 resolve, or appear, at the transition between exposed and unexposed areas of the photosensitive material where the intensity profile 110 crosses the dose level 150.

The contrast of an edge is basically the slope of the intensity profile at the dose level. A steeper slope means that the edge is more sharply defined. A gradual slope means that the edge is less sharp or fuzzy. The sharper the contrast, the more precision and predictability there is in edge placement, and the smaller the features can be.

If a feature is large compared to the wavelength of the light, the intensity profile tends to be deep and sharp. As the feature size gets smaller however, the intensity profile gets shallower and broadens out. For instance, FIG. 2 illustrates two more intensity profiles, profile 210 and profile 230. Profile 210 corresponds to a feature 220 having a feature size that is large compared to a wavelength of the light. Profile 230 corresponds to a feature 240 having a feature size that is small compared to the wavelength.

This broadening of the intensity pattern as feature sizes near or drop below the wavelength of the light source creates a number of design challenges. The projected image no longer identically reflects the shapes of the features in the mask. Edge placement becomes increasingly less precise, often leading to the ends of lines being cut off and sharp corners being rounded. Neighboring features become increasingly interdependent as their intensity patterns overlap, often causing features to "bleed" into each other or not resolve at all.

An area of study called resolution enhancing technology (RET) is constantly in development to compensate for, or reduce, these effects in near- or sub-wavelength photolithographic processes. Examples of RETs include optical proximity correction (OPC), sub-resolution assist features (SRAFs), off-axis illumination, dipole illumination, and phase shift masks (PSM).

OPC moves feature edges in a mask, essentially shifting an intensity profile one way or another to move the projected edge. Other RETs also change the position of projected edges, but do so more by changing the shape of the intensity profile than by shifting the intensity profile.

For instance, SRAFs take advantage of the fact that intensity profiles of neighboring edges influence one another. SRAFs themselves are so narrow that their intensity profiles are not deep enough to resolve—hence the name "sub-resolution." But, their intensity profiles can overlap with the intensity profiles of neighboring edges. In which case, SRAFs are features that are added to a mask near an existing feature, creating a combined intensity profile with a different contrast, changing the position of the projected edges.

Off-axis illumination and di-pole illumination are also RETS that change intensity profiles. Di-pole illumination is basically an extreme form of off-axis illumination. Edges that are oriented perpendicular to the orientation of the illumination have sharper intensity profiles and image more clearly than if illuminated by an on-axis light source.

PSM takes advantage of the interference characteristics of light.

RETs often use edge classifications to determine what kind of enhancement to apply to a particular edge. For instance, SRAFs are usually inserted in a design based on spacing. Spacing is the outward distance from an edge of a feature to another edge. Different spacing classifications, or ranges of spacings, often receive different SRAF treatment.

FIG. 3 illustrates spacing classifications for two features, feature 310 and feature 320. Spacing 315 is the distance between edges 330 and 340. In which case, edges 330 and 340 may be assigned to a spacing classification, or range of spacings, that includes spacing 315. Edge 350, however, has no opposing edge. In which case, edge 350 may be assigned to a spacing classification for isolated edges.

In the illustrated embodiment, the two different spacing classifications receive different SRAF treatment. Specifically, edges 330 and 340 receive SRAF 335 centered between them. Edge 350, on the other hand, receives a pair of SRAFs 355 at some predetermined distances 360 and 365.

For OPC, edges are often classified based on length and relation. For instance, FIG. 4 illustrates a feature 410 having several different edge classifications. Edge fragments at corner 420 may be classified as convex corner edge fragments, which are pushed out to form serif 425 to reduce the rounding of the corner in the projected image. Edge fragments at corner 430 may be classified as concave corner edge fragments, which are pushed in to form inverted serif 435, also to reduce rounding in the projected image. Edge fragments at line ends 440 and 450 may be classified as line end edge fragments, which have been pushed out to form hammer heads 445 and 455, respectively, to reduce line end cut-off in the projected image.

For di-pole illumination, or off-axis illumination, edges are often classified based on orientation. For example, di-pole illumination often uses two masks. One mask is illuminated with a horizontal di-pole and one mask is illuminated with a vertical di-pole. Since edges that are oriented perpendicular to the orientation of the di-pole have sharper intensity profiles and resolve more clearly, edges are usually classified as either horizontal or vertical and assigned to the appropriate mask. The corresponding space in the opposite mask includes a shield to prevent the area from being exposed by the other mask.

For PSM, edges are often classified so that neighboring features are assigned to different phases to reduce the influence the neighboring edges have on one another. Like di-pole illumination, PSM often involves two masks, a phase mask and a trim mask. In which case, like di-pole illumination, an edge assigned to one mask will often have a corresponding shield in the other mask.

At best, most classification systems used in resolution enhancing technologies (RETs) merely suggest that an edge may benefit from a particular enhancement. Spacing-based classifications usually only take into consideration a fixed number of neighboring edges. Edges that run diagonally through a design are often difficult to classify to either a horizontal or a vertical di-pole mask. And, features may have complex shapes that are interwoven with multiple neighbors, making it very difficult to classify edges of neighboring features to different phases in PSM.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

FIG. 22A indicates the initial contrast distribution—$C_0$—that will be used to classify edges as being high/low contrast when applying an X dipole single exposure. FIG. 22B is the contrast distribution resulting from a Y dipole exposure. Notice how the contrast distributions are not symmetrical. This means that the design is not XY balanced. The current example assumes a 50:50 dose split for both masks, but a finer implementation can use this information to determine the best dose split.

FIG. 27A shows the successive improvement of the method for a weak dipole system.

DETAILED DESCRIPTION

Figure 1:
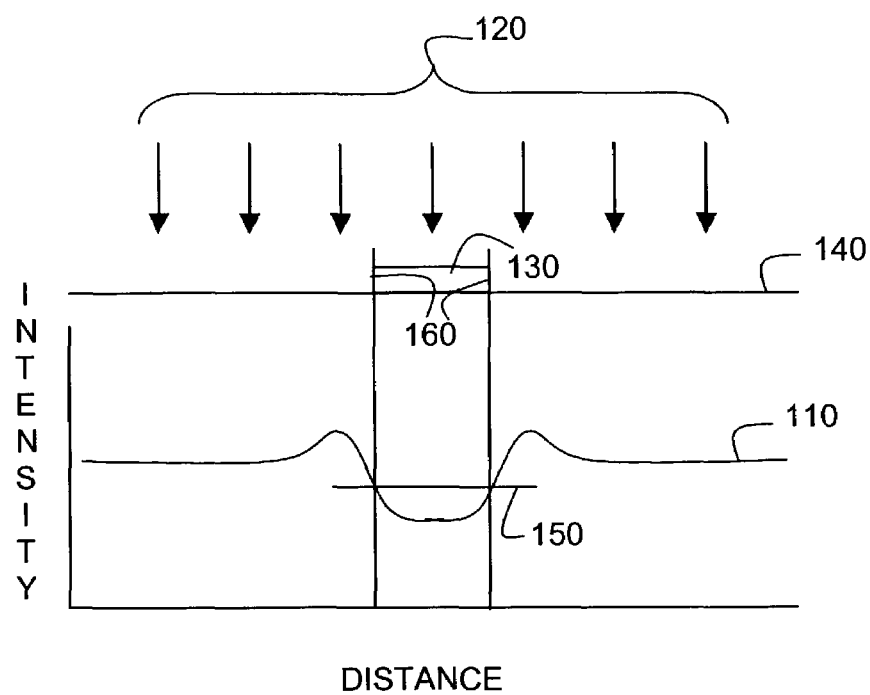
FIG. 1 illustrates one embodiment of an intensity profile.
Figure 2:
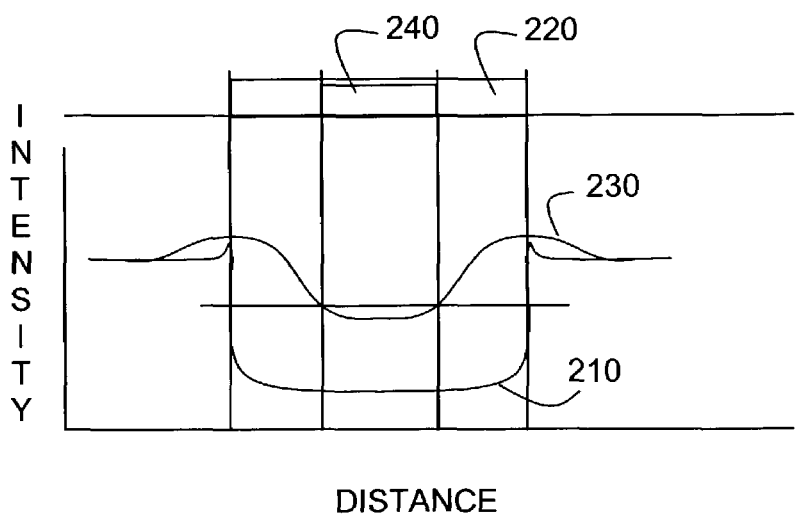
FIG. 2 illustrates another embodiment of an intensity profile.
Figure 3:
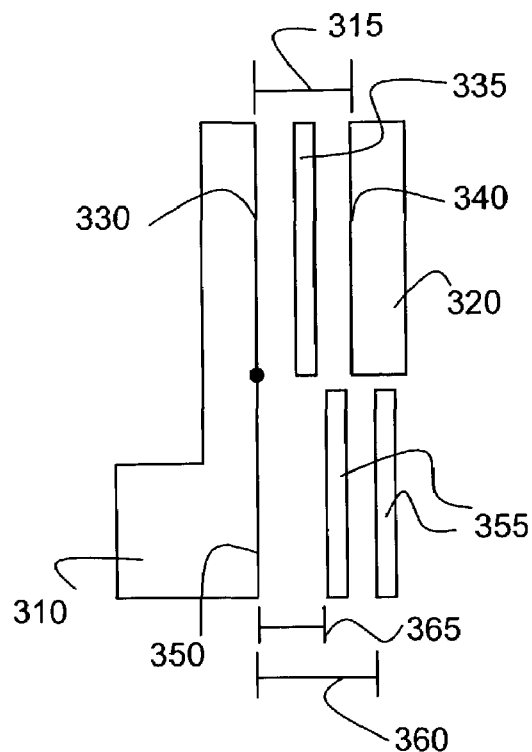
FIG. 3 illustrates one embodiment of sub-resolution assist features (SRAFs).
Figure 4:
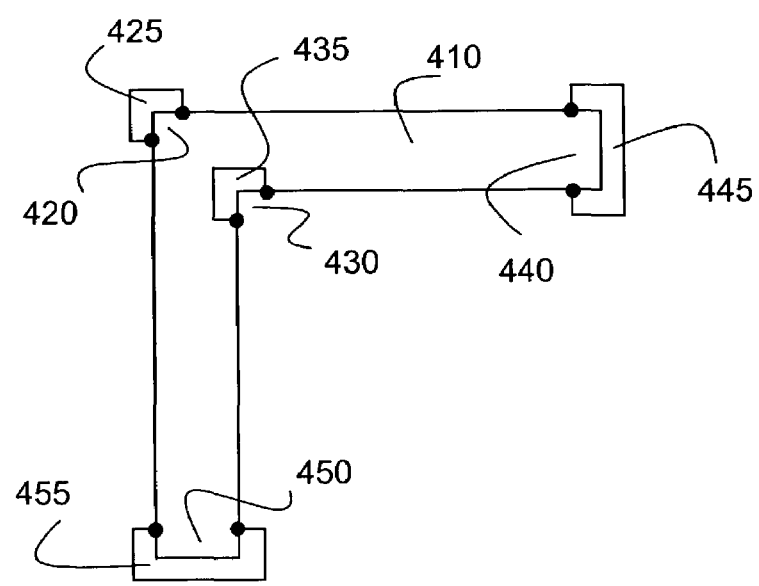
FIG. 4 illustrates one embodiment of optical proximity correction (OPC).
Figure 5A:
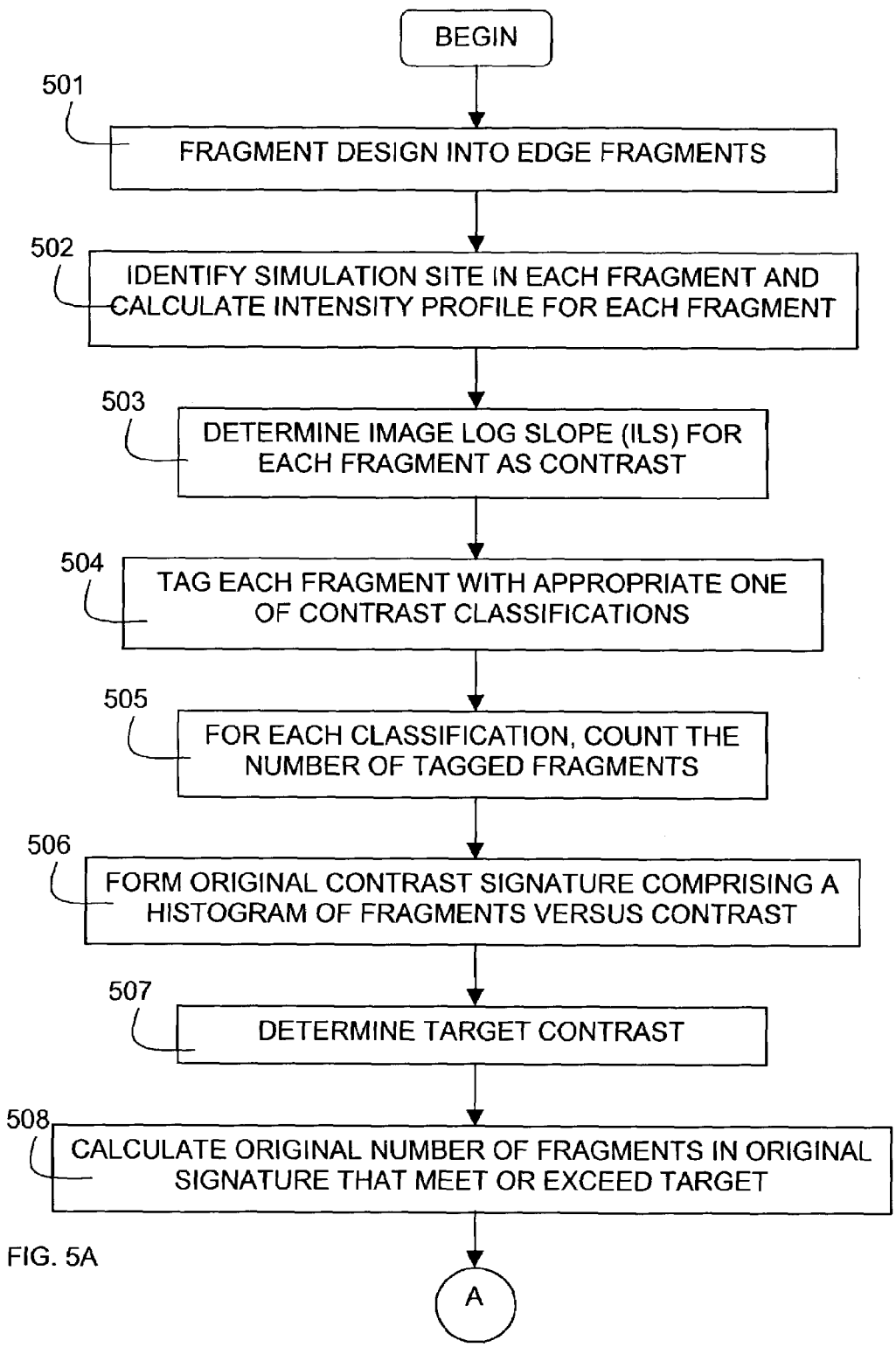
FIGS. 5A through 5E illustrate one embodiment of the present invention.
Figure 5B:
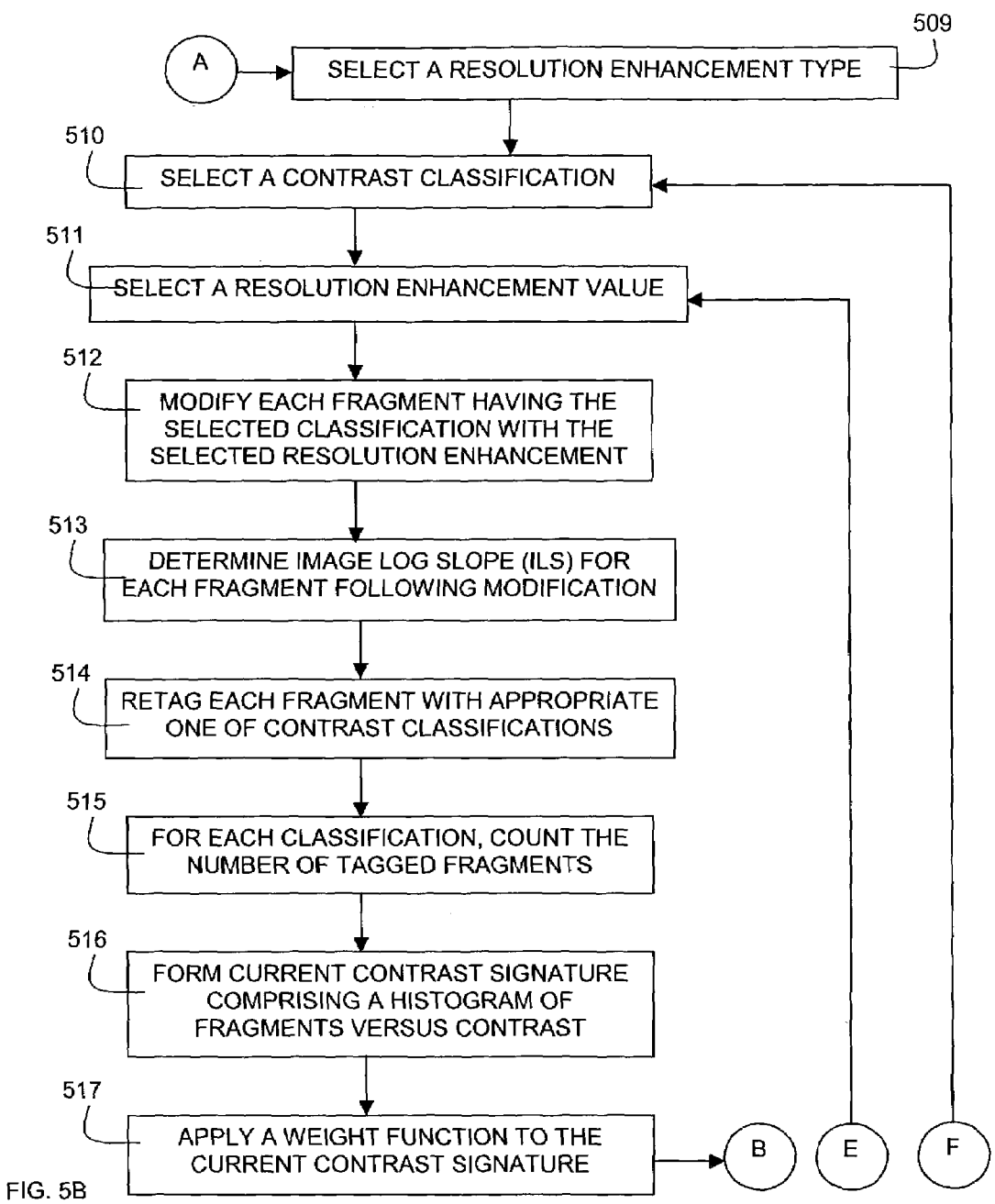
Figure 5C:
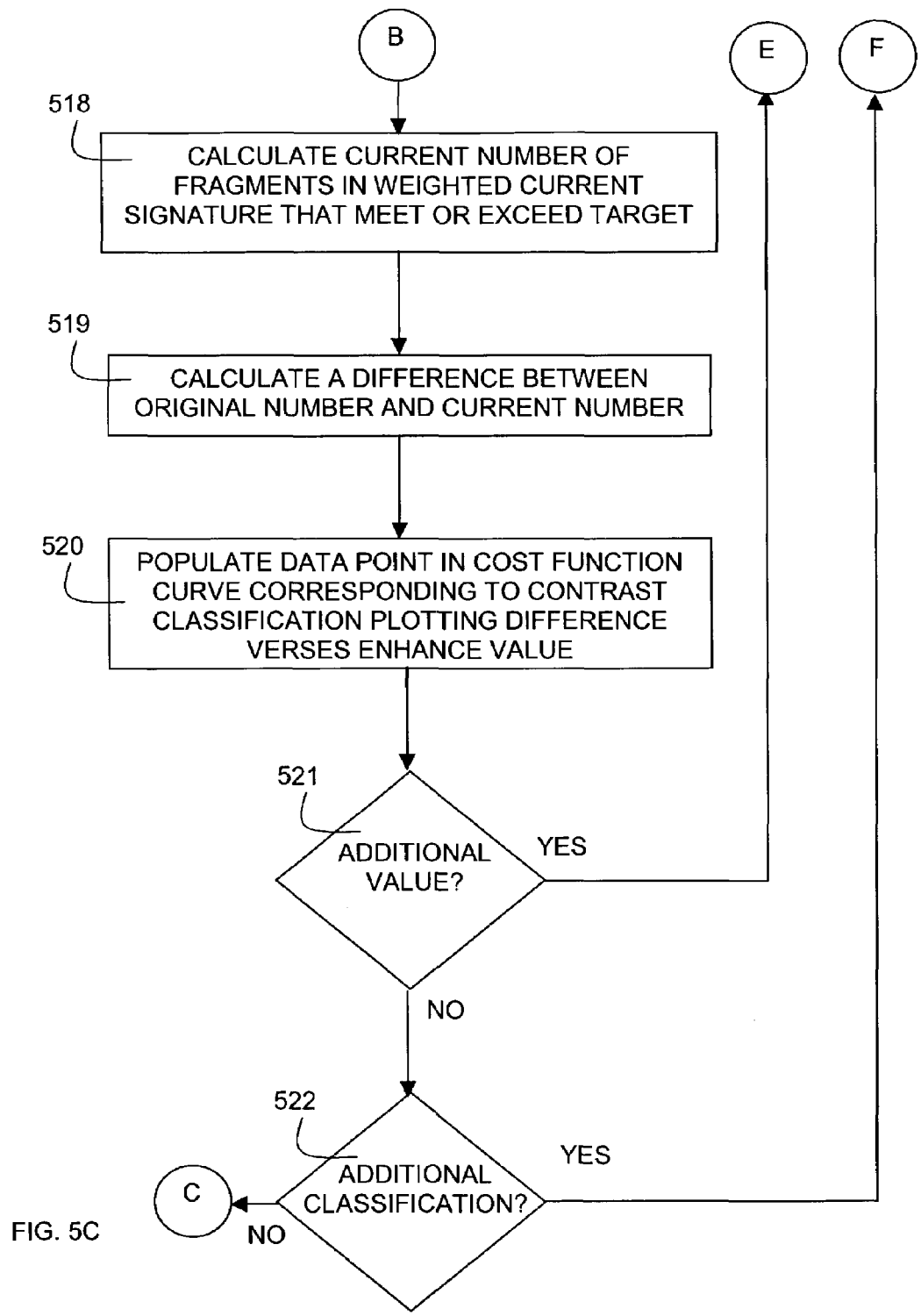
Figure 5D:
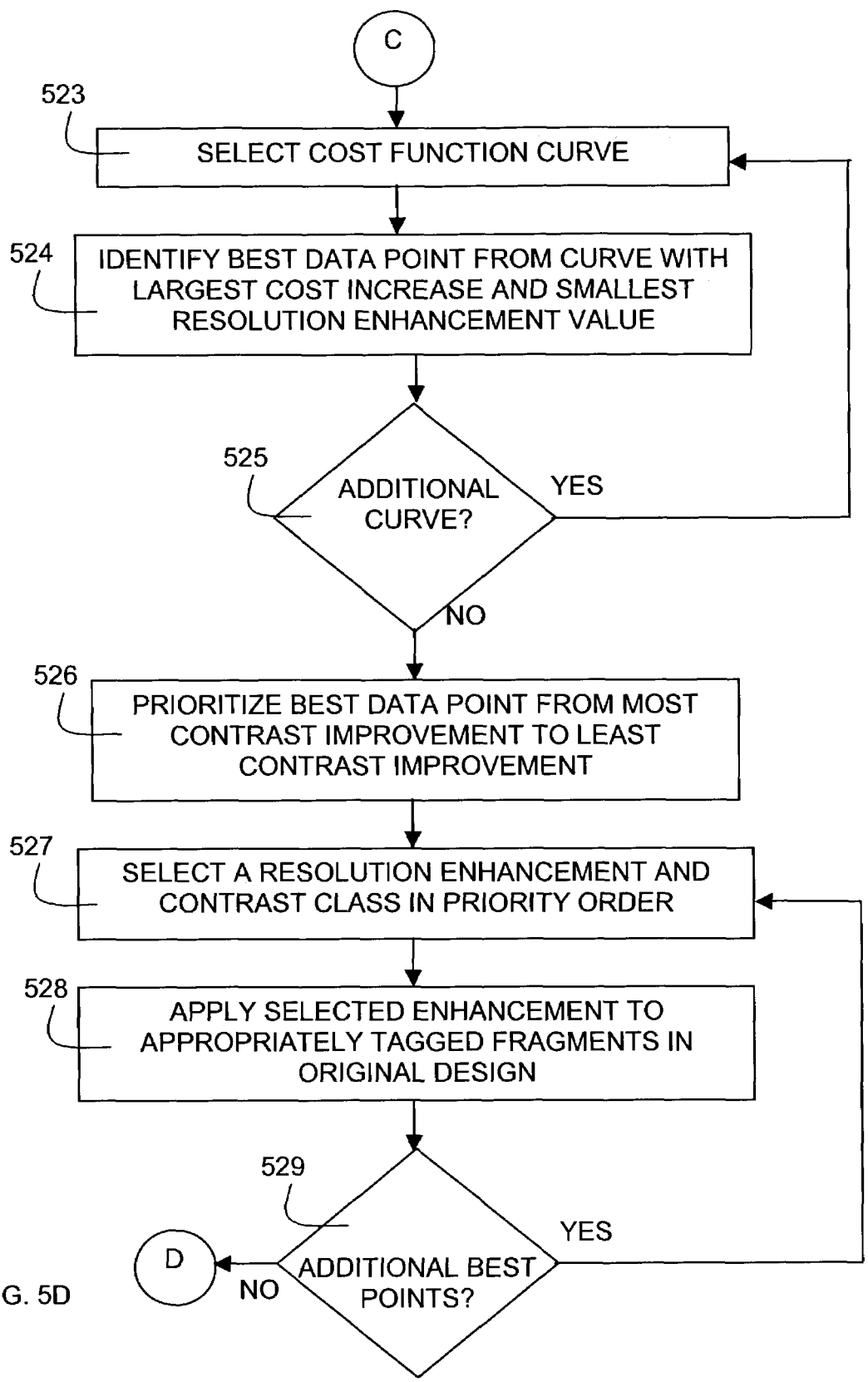
Figure 5E:
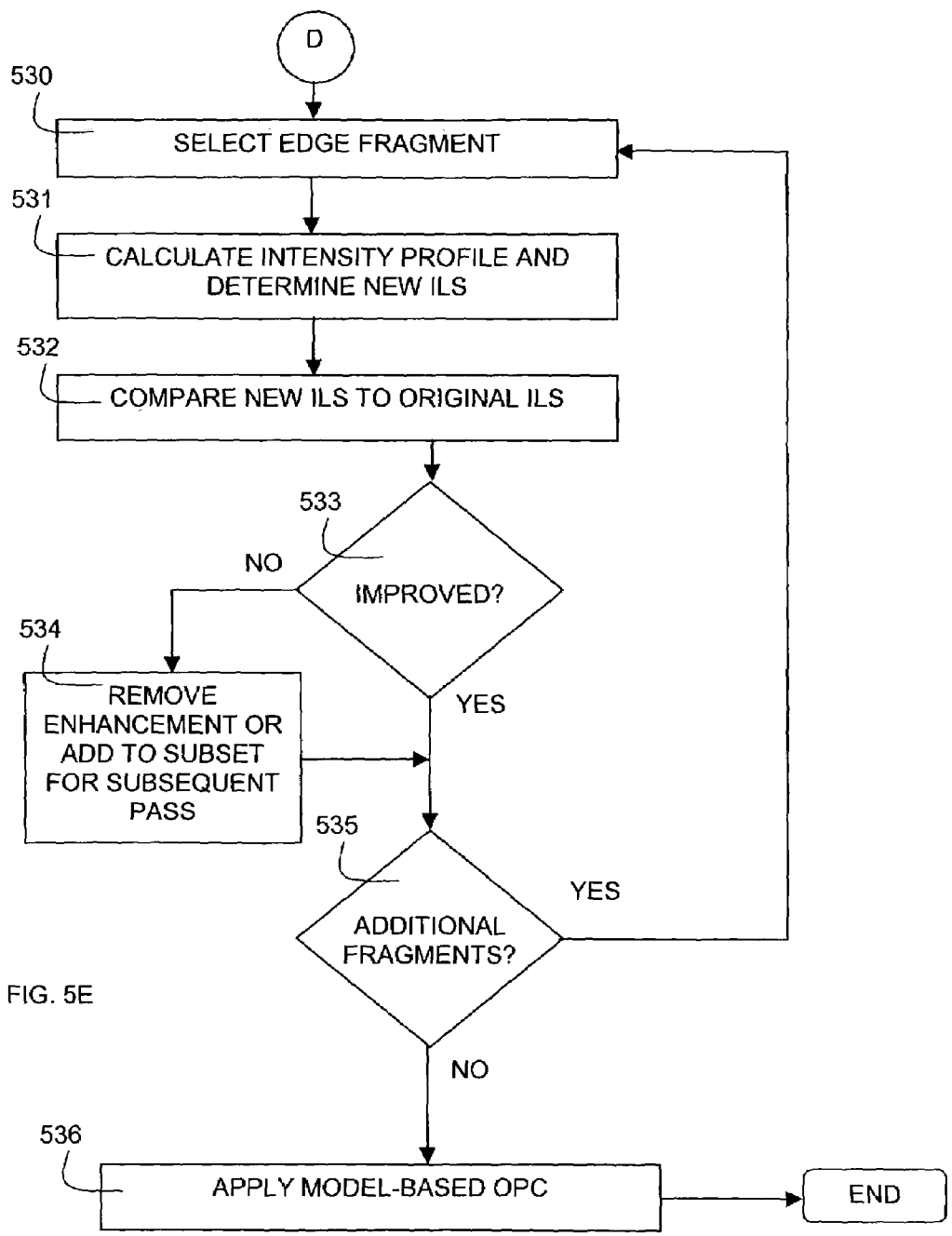

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful for understanding the present invention. However, the order of description should not be construed as to imply that these operations are necessarily performed in the order they are presented, nor even order dependent. Lastly, repeated usage of the phrase "in one embodiment" does not necessarily refer to the same embodiment, although it may.

Embodiments of the present invention apply resolution enhancing technologies (RETs) to edges of features in photolithographic designs based on contrast classifications of the respective edges to modify the edge's contrast. For example, embodiments of the present invention can be applied to a photolithographic design on a global basis to modify the overall contrast of the design.

Contrast is a direct indication of how well an edge will resolve in a projected image. In which case, contrast classification directly identifies edges that will be most difficult to resolve. Edges with higher contrast appear sharper, allowing for more detailed and smaller feature sizes.

Rather than applying a RET to change edge placement of a projected image by shifting an intensity profile, embodiments of the present invention apply a RET to modify the contrast of the edge and change the slope of the edge's intensity profile. By improving contrast, edges can be placed with more precision, potentially leading to better overall enhancement solutions. For example, embodiments of the present invention can sharpen an intensity profile prior to applying OPC so that OPC does not need to move an edge as far it otherwise would.

Furthermore, embodiments of the present invention can apply virtually any RET that can modify contrast. For instance, embodiments of the present invention can apply sub-resolution assist features (SRAF), off-axis illumination, di-pole illumination, phase shift mask (PSM), and the like.

As used herein, the terms edge and edge fragment are interchangeable and refer in general to any segment defining a boundary, or a part of a boundary, of a feature in a photolithographic design. One data format commonly used to define such a design is GDSII, in which features comprise collections of interconnected points in two-dimensional space. In GDSII, an edge or edge fragment may comprise a pair of interconnected points in the two-dimensional space.

FIGS. 5A through 5E illustrate one embodiment of the present invention for global contrast modification. In general, the present invention applies a RET to an edge based on the edge fragment's contrast class, thereby modifying the edge's contrast. The illustrated embodiment repeatedly applies this operation to multiple edges in a design and explores the overall contrast change for a variety of enhancement options.

The illustrated embodiment includes a number of implementation-specific details. Other embodiments may not include all of the illustrated operations, may perform the operations in a different order, may combine and/or separate one or more of the operations, and may include additional operations. Several functions, curves, graphs, and histograms are mentioned in FIGS. 5A through 5E. Examples of many of these are illustrated in subsequent figures. The illustrated embodiment assumes that the optical conditions, such as focus, dose level, numerical aperture, and the like, have already been determined.

At 501, a photolithographic design is fragmented into edges. Fragmenting can be done in a number of different ways and often involves adding additional data points in a design to break up long edges into smaller fragments. With smaller fragments, more accurate and detailed enhancements can be applied, but the trade-off tends to be additional complexity, processing time, etc.

At 502, the process identifies a simulation site in each fragment and calculates an intensity profile for each fragment at the simulation site. The calculation can be done in any number of ways. In one embodiment, the simulation site is at the center of an edge fragment and the intensity profile is calculated along a perpendicular cut line intersecting the edge fragment at the simulation point. The calculation may take into consideration features in the design within an area of influence surrounding the simulation site. The radius of the area of influence can be selected in any number of ways, but is often related to the optical conditions of the particular system being used. The larger the radius, the more accurate, and time consume, the calculation.

At 503, the process determines the contrast for each edge fragment. The illustrated embodiment uses the image log scale (ILS) as an equivalent to contrast. One way to calculate the ILS is to take the log of the intensity profile, and determine the maximum derivative of the log function. The derivative is the slope of the function, so the ILS is taken at the maximum slope. Other embodiments may calculate contrast in different ways.

At 504, the process tags each edge fragment with a contrast classification depending on the contrast value calculated in 503. In other words, if an edge fragment has a contrast value that falls into a particular range of contrasts, that edge is assigned to a contrast classification corresponding to that range. Any number of contrast classifications can be used. In general, more classifications and smaller ranges tend to provide more accuracy, but also more complexity.

In one embodiment, operations 502, 503, and 504 are all part of the fragmenting operation 501. That is, in one embodiment, a contrast calculation is performed at regular intervals along each edge in the design. The contrast value at each interval is compared to the ranges of contrast values defined by the contrast classifications. If the contrast value switches from one range to another, the edge is fragmented and the newly formed fragment is tagged with the new contrast classification. This approach is often referred to as model-based fragmenting or model-based tagging.

Once the edges have all been tagged, the process counts the number of edges that have been tagged with each contrast classification at 505. For instance, if there are 20 contrast classes, the process will count the number of edges assigned to each of the 20 contrast classes.

At 506, an original contrast signature is formed. In the illustrated embodiment, the original contrast signature is a histogram of fragments versus contrast. For instance, with 20 contrast classes, there will be 20 data points, each plotted as a number of edge fragments in a particular contrast range.

At 507, the process determines a target contrast. The target contrast is a minimum desired contrast level. The target level can be selected in any number of ways, but is often dependent upon the complexity of the design and the quality of optical system being used.

At 508, the process calculates the number of fragments in the original contrast signature that meet or exceed the target contrast. With 20 contrast classes, this is simply a matter of adding the numbers of edge fragments in each contrast class that define contrast ranges in excess of the target contrast. More complicated systems, with larger numbers of contrast classes, may take the integral of the original contrast from the target contrast up to the maximum contrast to determine the area under the curve, with the area being equivalent to the number of edge fragments.

At 509, the process selects a resolution enhancement type. This could include selecting a high level RET, such as SRAF, di-pole, PSM, or the like. Each of these high level RETs could also include a number of variables from which to select. For instance, within SRAF, operation 509 could include selecting the spacing between an SRAF and an edge, the width of an SRAF, the number of SRAFs, the spacing separating multiple SRAFs, and the like. Within di-pole or PSM, 509 could include selecting, for instance, the distance to which a shield is extended in a second mask to protect an edge in a first mask.

In the illustrated embodiment, just one RET, or one variable within a RET, can be selected per application of the process. In which case, the process would have to restart in order to select another RET, or another variable within a RET. In one embodiment, the array of RETs and/or variables from which to choose is limited by factors such as manufacturability, optical conditions, etc. For instance, the width of an SRAF may be fixed in a particular system, so the width variable may not be eligible for selection.

At 510, a contrast classification is selected. As will be seen below, the process will loop back to 510 multiple times until all of the contrast classes have been selected and used by the process. The contrast classes can be selected in any order.

At 511, a resolution enhancement value is selected. For instance, where SRAF spacing was chosen back at operation 509, operation 511 could include selecting a particular spacing value. As will be seen below, if a range of values are available, the process can loop back multiple times to select and use one value at a time until the range values have all been used. In one embodiment, the range of values may be limited by factors such as manufacturability, optical conditions, etc. For instance, the spacing increments for SRAFs may be fixed in a particular system to a certain value, so only certain spacings may be eligible for selection.

At 512, each edge fragment that is assigned to the selected contrast classification is modified with the selected RET and the selected RET value. For instance, each edge in the selected contrast class may receive an SRAF at a particular spacing and width.

At 513, the process recalculates the contrast (the ILS in this embodiment) for all of the edges, both in the selected contrast class and outside the selected contrast class. Then, the edges are all temporarily retagged to the appropriate contrast classes based on their current contrast values at 514. At 515, after the edges have been retagged, the number of edges in each class are counted again to form a current contrast signature comprising a new histogram of fragments versus contrast.

At 517, the illustrated embodiment applies a weight function to the current contrast signature. The weight function can be used to emphasize the number of edges having large contrast values so that slight differences are easier to detect in later comparisons, as discussed below. Other embodiments may not use a weight function.

At 518, the process calculates the number of fragments in the current signature that meet or exceed the target contrast. As with the original signature, this operation could include integrating to get the area under the curve. Of course, the weight function can substantially inflate the number of fragments.

At 519, the process calculates a difference between the original number of fragments that exceed the target contrast and the current number of fragments that exceed the target contrast in the current, weighted contrast signature.

At 520, the difference is used as a data point in a cost function curve. Each iteration through the process adds another data point. The curve is a function of the difference between the two signatures versus the enhancement value selected at 511. Different curves will be created with each curve corresponding to a different contrast class.

At 521, the process checks for additional enhancement values. For instance, if a range of SRAF spacings are available, and not all of the spacings have been used yet, the process will loop back to 511 to select another value. The process will loop through 511 to 521 until all of the values have been used. A data point will be added to a curve corresponding to the currently selected contrast class for each pass through 520. Each iteration will revert back to the original design so that each data point represents the contrast improvement over the original design for just one enhancement applied to just one contrast class.

When no more values are left at 521, the process proceeds to 522 where it checks for additional contrast classes. If at least one additional class remains to be used, the process loops back to 510 to select a new class. The process will iterate through 510 to 522 until all of the contrast classes have been used, and, for each new class, the process will iterate through 511 to 521 for each enhancement value. Each iteration through 522 will create a new cost function curve corresponding to a new contrast class, with a new data point being added to a given cost function curve for each pass through 520.

When no more contrast classes are left at 522, the process proceeds to 523 to select one of the cost function curves. The curves can be selected in any order. At 524, the process identifies a "best" data point in the curve indicating the largest global contrast increase over the original contrast signature while using the smallest resolution enhancement value. That is, if two data points in a curve indicate the same amount of improvement, the data point corresponding to the smaller enhancement value is selected. In the case of SRAF spacing, the smaller enhancement value would be the shorting, or closer, spacing value. In the case of SRAF width, the smaller value would be the narrower width. Similarly, in the case of the number of SRAFs, the smaller value would be the lower number of SRAFs.

At 525, the process checks for additional curves and loops through 523 and 524 until the best data point is identified in each curve. Then, at 526, the process prioritizes the best data points for each curve, from the data point providing the most global contrast improvement to the data point providing the least contrast improvement. Here is where the weight function from operation 517 can help. The weight function emphasizes the differences between data points to more easily distinguish levels of contrast improvement. In one embodiment, a tie can be resolved in the priority order by favoring a lower contrast class. That is, if the best data point from two contrast classes provide the same global contrast improvement, it is usually more beneficial to give priority to the lower contrast.

At 527, a resolution enhancement that corresponds to the highest priority data point is selected. At 528, the selected resolution enhancement is applied to the edge fragments in the original design that are tagged with the respective contrast classification. At 529, the process checks for additional data points, and loops back to 527 if there is another. In this second iteration, the second highest priority enhancement is applied to the design in addition to the previous enhancement. No single edge receives both enhancements because every edge is assigned to one contrast class, and each contrast class receives only one enhancement. Similarly, the enhancement for the third iteration is applied in addition to the first and second enhancements. The process continues to iterate through 527 to 529 until all of the data points have been used to apply enhancements to the design in the priority order.

Once all of the enhancements are applied, the global contrast signature of the design is likely to have improved substantially. However, since the enhancements are evaluated individually by the process, but multiple of enhancements are ultimately applied together with one enhancement per contrast class, the enhancements are likely to conflict and degrade contrast in at least a small number of edges.

In which case, at 530, after all the enhancements have been applied, the process selects an edge fragment in the modified design, calculates an intensity profile and contrast for the edge fragment at 531, and compares the current contrast to the original contrast for that edge. At 533, if the contrast has improved, the process checks for more fragments at 535 and loops back to 530 for each edge fragment in the design. At 533, for any edge fragment for which the current contrast is not improved over the original contrast, the process does one of two things at 534. In one embodiment, the process simply removes any enhancement that had been applied to the edge fragment in question. Often times, by removing the enhancement, the edge's contrast will substantially revert back to the original contrast. The process can also add the edge to a subset of edges to be re-processed. That is, the entire process of FIGS. 5A through 5E can be repeated, using the design as it was modified in the first pass through the process as the "new" original design. The second pass can explore additional enhancements for the subset of problematic edges. For instance, if the process explored SRAF spacing in the first pass, then the second pass could explore SRAF width, or the number of SRAFs, or the process could switch to an entirely different RET.

At 536, the last operation in the process is to apply model-based OPC to the design. Since the process is likely to have improved the edge contrast over much of the design, OPC will generally operate faster and arrive at a superior solution than it otherwise would.

Other embodiments may switch operates 510 and 511. That is, rather than iterating through a range of enhancement values for each contrast class, an alternate embodiment may iterate through a range of contrast classes for each enhancement value.

If the selected RET fails to improve the global contrast to a satisfactory level, or if a user simply wants to explore other RETs for potentially better solutions, the process can be restarted and another RET or variable can be selected at 509.

Various embodiments of the present invention can be applied to virtually any RET and virtually any variable within a RET. For instance, for a double exposure RET, the process can be performed twice, once for each expose. For example, in di-pole illumination, an original signature can be determined for a horizontal di-pole and enhancements can be explored with respect to the horizontal original signature. Another original signature can be determined for a vertical di-pole and enhancements can be explored with respect to it. All of the data points can be compared from both exposures and a best data point can be selected for each contrast class.

Figure 6:
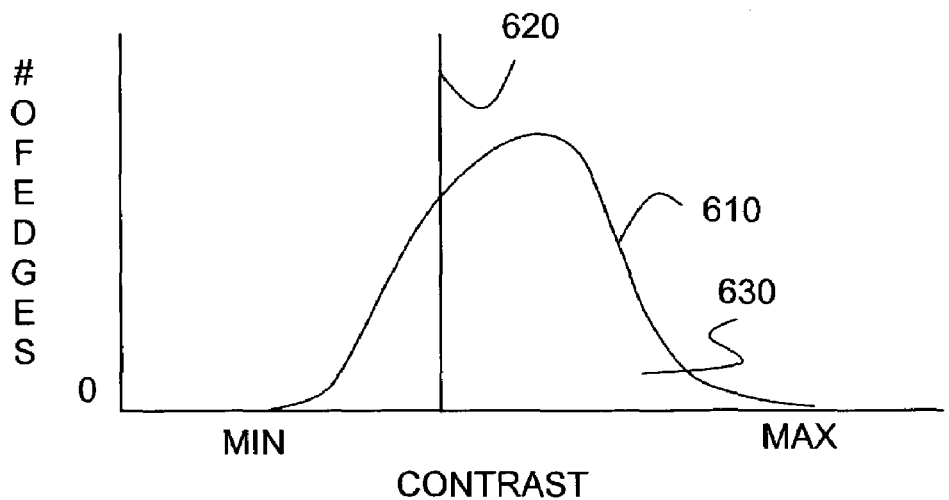
FIG. 6 illustrates one embodiment of a contrast signature.

FIGS. 6 through 10 illustrate some examples of the various functions and curves mentioned in FIGS. 5A through 5E. In FIG. 6, a contrast signature 610 is a histogram plotted as a function of the number of edges per contrast value. Contrast signature 610 includes edges to either side of target contrast 620. In other words, the edges that have acceptable contrasts are those occupying area 630 under the curve 610 and to the right of target contrast 620. The edges to the left of target contrast 620 have unacceptably low contrasts. In which case, one embodiment of the present invention would start by exploring RETs for the unacceptably low edges. Another embodiment of the present invention may only explore RETs for the unacceptably low edges.

Figure 7:
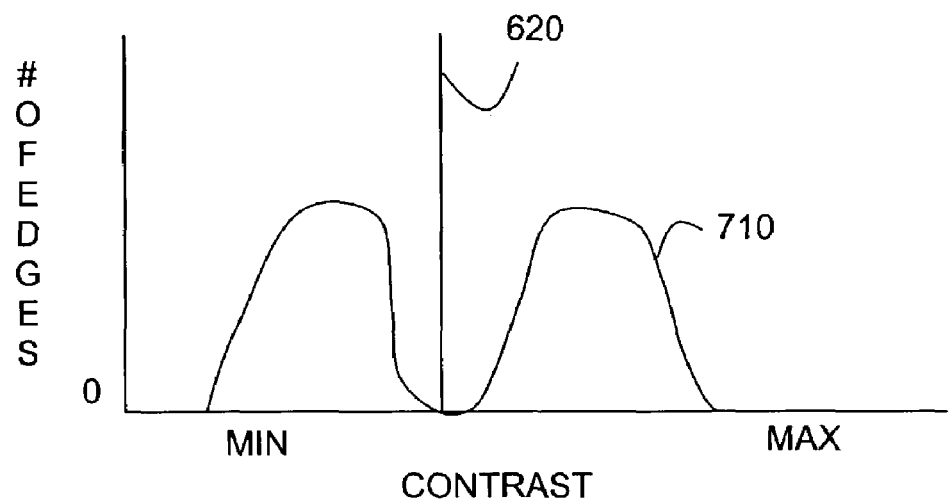
FIG. 7 illustrates one embodiment of a weight function.
Figure 8:
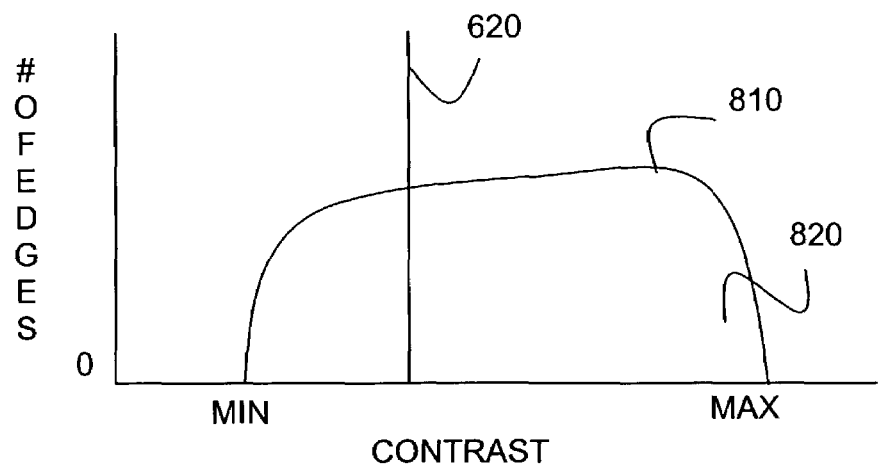
FIG. 8 illustrates one embodiment of a weighted, contrast signature.

FIG. 7 illustrates one example of a weight function 710. By taking the dot product of weight function 710 with a contrast signature, such as signature 610 from FIG. 6, a weighted contrast signature is produced. FIG. 8 illustrates one example of a weighted contrast signature 810. The weight function emphasizes the high contrast edges, "magnifying" the area 820 under the curve 810 and to the right of 620. This magnification can make it easier to recognize the differences between two different cost functions.

Figure 9:
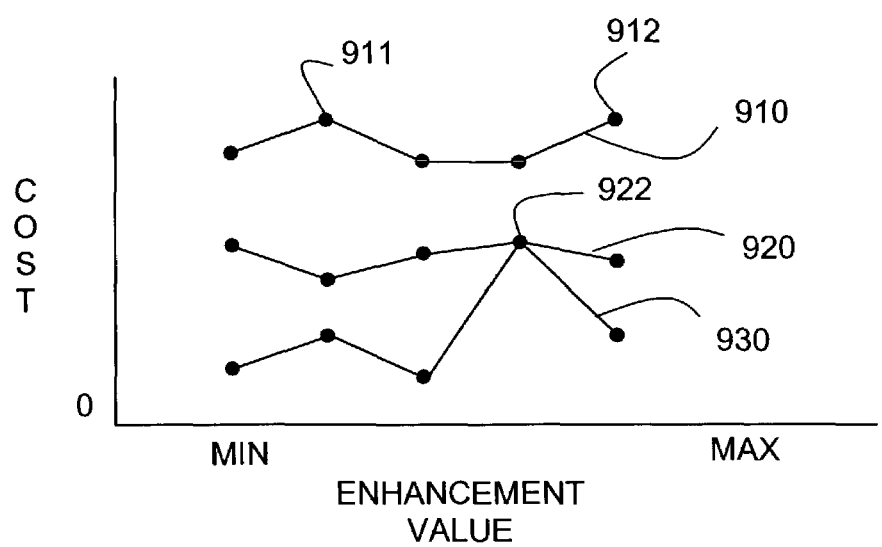
FIG. 9 illustrates one embodiment of cost function curves.

FIG. 9 illustrates one example of a set of cost function curves. Each of the curves 910, 920, and 930 corresponds to a different contrast classification. Each data point in a curve represents the difference between the number of edges with acceptable contrast in the original contrast signature, such as area 630, and a current weighted, contrast signature, such as area 820. In the illustrated embodiment, points 911 and 912 provide the same contrast improvement, but point 911 uses a smaller enhancement value. Therefore, point 911 will generally be selected over point 912.

Similarly, both curves 920 and 930 include the same data point 922. That is, the best data point in both curves provides the same contrast improvement. In order to prioritize the data points, one embodiment of the present invention grants a higher priority to the data point corresponding to the lower contrast classification. In which case, assuming curve 930 corresponds to a lower contrast classification, the enhancement indicated by data point 922 will be applied to the contrast class of curve 930 before the contrast class of curve 920.

Figure 10:
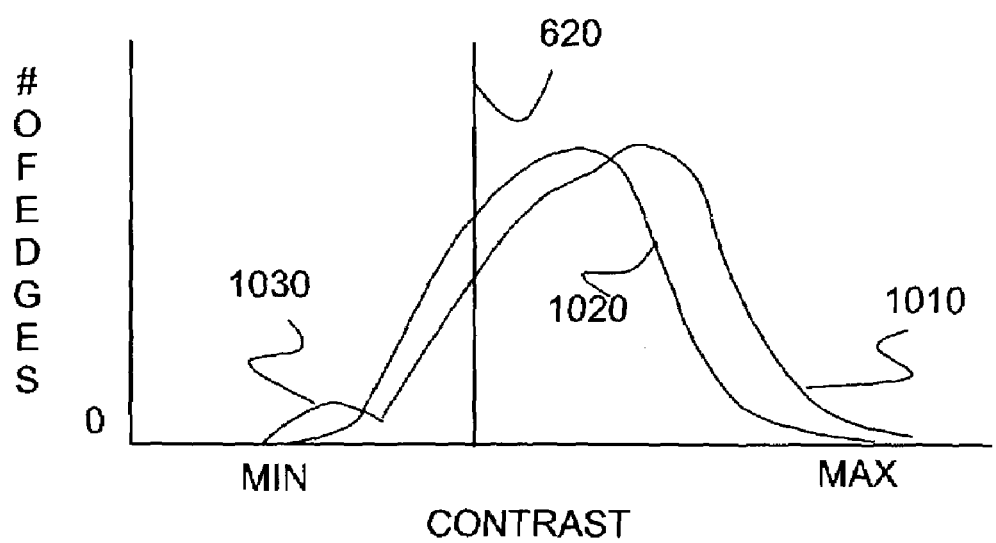
FIG. 10 illustrates one embodiment of contrast signatures where some contrasts are worse after enhancement.

FIG. 10 illustrates one example where the contrast for some edges is worse after all the enhancements are applied. For instance, curve 1020 represents the original contrast signature and curve 1010 represents the contrast signature after all of the enhancements have been applied. Curve 1010 includes a "tail" 1030 where the contrast is worse than in the original curve 1020. As discussed above, various embodiments of the present invention may eliminate the enhancements from the edges in tail 1030, and/or assign those edges to a subset of edges and run them through the process again with a different RET selection.

Figure 11:
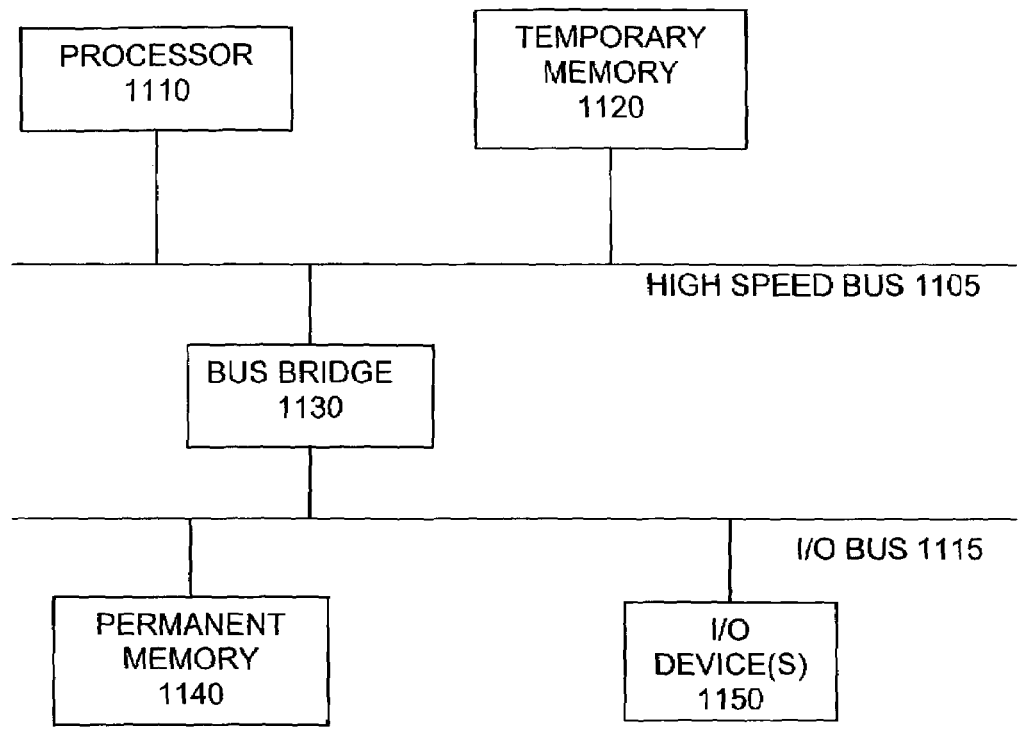
FIG. 11 illustrates one embodiment of a hardware system to implement the present invention.

FIG. 11 illustrates one embodiment of a hardware system intended to represent a broad category of computer systems such as personal computers, workstations, and/or embedded systems. In the illustrated embodiment, the hardware system includes processor 1110 coupled to high speed bus 1105, which is coupled to input/output (I/O) bus 1115 through bus bridge 1130. Temporary memory 1120 is coupled to bus 1105. Permanent memory 1140 is coupled to bus 1115. I/O device(s) 1150 is also coupled to bus 1115. I/O device(s) 1150 may include a display device, a keyboard, one or more external network interfaces, etc.

Certain embodiments may include additional components, may not require all of the above components, or may combine one or more components. For instance, temporary memory 1120 may be on-chip with processor 1110. Alternately, permanent memory 1140 may be eliminated and temporary memory 1120 may be replaced with an electrically erasable programmable read only memory (EEPROM), wherein software routines are executed in place from the EEPROM. Some implementations may employ a single bus, to which all of the components are coupled, or one or more additional buses and bus bridges to which various additional components can be coupled. Those skilled in the art will be familiar with a variety of alternate internal networks including, for instance, an internal network based on a high speed system bus with a memory controller hub and an I/O controller hub. Additional components may include additional processors, a CD ROM drive, additional memories, and other peripheral components known in the art.

In one embodiment, the present invention, as described above, is implemented using one or more hardware systems such as the hardware system of FIG. 11. Where more than one computer is used, the systems can be coupled to communicate over an external network, such as a local area network (LAN), an internet protocol (IP) network, etc. In one embodiment, the present invention is implemented as software routines executed by one or more execution units within the computer(s). For a given computer, the software routines can be stored on a storage device, such as permanent memory 1140.

Figure 12:
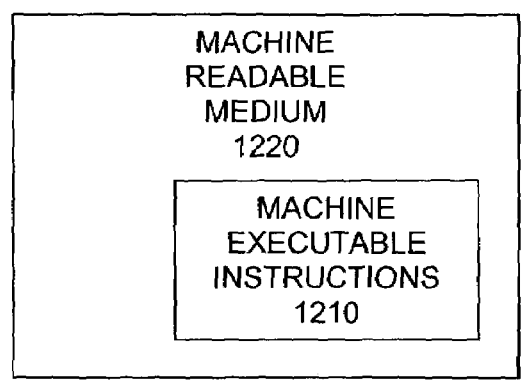
FIG. 12 illustrates one embodiment of a machine-readable medium to store executable instructions to implement the present invention.

Alternately, as shown in FIG. 12, the software routines can be machine executable instructions 1210 stored using any machine readable storage medium 1220, such as a diskette, CD-ROM, magnetic tape, digital video or versatile disk (DVD), laser disk, ROM, Flash memory, etc. The series of instructions need not be stored locally, and could be received from a remote storage device, such as a server on a network, a CD ROM device, a floppy disk, etc., through, for instance, I/O device(s) 1150 of FIG. 11.

From whatever source, the instructions may be copied from the storage device into temporary memory 1120 and then accessed and executed by processor 1110. In one implementation, these software routines are written in the C programming language. It is to be appreciated, however, that these routines may be implemented in any of a wide variety of programming languages.

In alternate embodiments, the present invention is implemented in discrete hardware or firmware. For example, one or more application specific integrated circuits (ASICs) could be programmed with one or more of the above described functions of the present invention. In another example, one or more functions of the present invention could be implemented in one or more ASICs on additional circuit boards and the circuit boards could be inserted into the computer(s) described above. In another example, field programmable gate arrays (FPGAs) or static programmable gate arrays (SPGA) could be used to implement one or more functions of the present invention. In yet another example, a combination of hardware and software could be used to implement one or more functions of the present invention.

Thus, a contrast-based resolution enhancing technology is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

The following description illustrates a number of additional embodiments of the present invention.

We propose a framework for the analysis and characterization of the efficacy of any resolution enhancement technique (RET) in lithography. The method is based on extracting a distribution of the image log slope (ILS) for a given layout under a predefined set of optical conditions. This distribution is then taken as the optical signature for the image local contrast of the design. The optical signature can be created for an entire layout, or only for certain cells believed to be problematic. Comparisons can be made between the optical signatures generated using different illumination/RET strategies. We have used this method to evaluate and optimize two different RET approaches: sub-resolution assist features (SRAF) and double exposure dipole illumination.

Traditional model-based OPC techniques improve the overall pattern fidelity of a lithographic image by minimizing edge placement errors (EPE)[i]. This technique has proven to be quite effective and commercially successful for 150 and 130 nm generations of IC technology. Image properties, however, are more traditionally evaluated by contrast and the ability to transfer modulation[ii]. When transferring images into high contrast photoresist, some of the image contrast lost in questionable imaging can be recovered, but the entire lithography process is better achieved if the original image has robust contrast to begin with.

[i] N. Cobb, A. Zakhor & E. Miloslavsky, "Mathematical and CAD Framework for Proximity Correction", Proc. SPIE 2726 pp. 208–222 (1996).

[ii] Glenn D. Boreman, "Transfer Function Techniques", Chapter 32 of Handbook of Optics II: Devices, measurements, and Properties 2$^{nd}$ Ed. (McGraw Hill, San Francisco, 1995)

Up to now, overall contrast throughout the layout has been achieved by using smaller wavelengths. With the acceleration of process generations as described in the International Technology Roadmap for Semiconductors (the ITRS),[iii] very aggressive approaches have been examined for their potential utility. Almost all of these techniques involve making a radical alteration to the layouts that are finally written on the reticle. Several involve double exposures of multiple reticles, each of which does not look anything like the desired pattern on the wafer.[iv] Software tools have evolved to manipulate the pattern data required for the creation of these extreme deviations from a WYSIWYG approach, relying on sophisticated image simulation engines embedded in the EDA tools. The simulators predict what the wafer image will look like, and make the appropriate correction.

[iii] http://public.itrs.net/Files/2001ITRS/Home.htm

[iv] Y. T. Wang, Y. C. Pati, H. Watanabe, and T. Kailath, "Automated design of Halftoned double-exposure phase-shifting masks", in Proc SPIE 2440, pp. 290–301 (1995).

To evaluate these simulated images from the lithographer's perspective, there are two requirements for a stable lithographic process: Pattern Fidelity and Image Transfer Robustness. The first is related to the design—stored in a layout as polygonal shapes—that must be transferred to a given substrate preserving the intended functionality of the devices. The second requirement, Image transfer robustness, as important as the first, has been studied in great detail, giving birth to the notion of common process window. If the image-transfer can only be reproduced under a very limited set of dose and exposure conditions—a small process window—, the process cannot be implemented in the real world, where small variations are always present and difficult to control at the level of precision required with current hardware.

Pattern fidelity has normally been addressed by first generation OPC (rule[v] and model based [1, vi, vii]). These methods do not generate additional polygons in the layout, but typically only move existing edges to achieve a given pattern fidelity. Second generation approaches add new features to the design in various ways.[viii,ix] For example, sub-resolution assist features (SRAF) are additional non-printing structures placed parallel to original edges in various ways.[x] They are typically inserted to allow isolated features to diffract light like dense features, reducing the Iso/Dense bias that can be a common lithographic problem.

[v] O. W. Otto, J. Garofalo, K. K. Low, C. M. Yuan, R. Henderson, C. Pierrat, R. Kostelak, S. Vaidya, and P. K. Vasudev, "Automated optical proximity correction—a rules based approach" in Proc. SPIE 2197, 278–293 (1994).

[vi] J. Stirniman and M. Rieger, "Fast Proximity correction with Zone Sampling", Proc. SPIE 2197, 294–301 (1994)

[vii] N. Cobb, "Fast optical and Process Proximity Correction Algorithms for Integrated Circuit Manufacturing" P. D. Dissertation, U. Cal. Berkeley (1999).

[viii] J. F. Chen and A. Matthews, "Mask for Photolithography", U.S. Pat. No. 5,242,770, (filed Jan. 16, 1992)

[ix] J. Garofalo, C. Biddick, R. Kostelak, and S. Vaidya, "Mask assisted off-axis illumination technique for random logic", J. Vac. Sci. Technol. Vol. B11, 2651–2658 (1993).

[x] Mansfield, S. M. et al., "Lithographic Comparison of Assist Feature Design Strategies", in Optical Microlithography XIII, Proc. SPIE 4000 (2000), pp. 63–76.

N. Cobb, A. Zakhor & E. Miloslavsky, "Mathematical and CAD Framework for Proximity Correction", Proc. SPIE 2726pp. 208–222 (1996).

Geometric rule-based approaches can return acceptable results when it is possible to distinguish how a particular feature will behave optically from purely geometric arguments. This is especially true in the traditional lithography ($k_1 > 0.7$) where feature-size and feature separation correlate well with contrast and other optical quantities. However in the deep sub-wavelength regime there are many instances in which the optical environment changes the optical behavior of geometrically equivalent features (e.g. critical features close to landing pads, 45° edges or low aspect ratio structures).

The method that we propose here classifies edges based on their own optical behavior. By using this approach, it is possible to generate masks that return a higher contrast image with acceptable edge placement error. The key parameter for classification is not based on EPE, as determined from the local image intensity, but based on local image contrast, as determined from the image log-slope (ILS). Optimization of the layout patterns for OPC is therefore not calculated by minimizing EPE, but my maximizing local contrast. Yet, OPC is needed in order to attain the target CD. By combining an RET optimization and OPC, the layout is closer to meet the robustness and resolution criteria required to any process worthy technology.

For the purpose of the current investigation, we define contrast as the maximum image log-slope in the vicinity of a given edge:

$$C = \left(\frac{d\ln I}{dx}\right)_{max} \quad (1)$$

Where C is Contrast, I is aerial image intensity, x is length.

It has been previously demonstrated that the Normalized Image Log-Slope (NILS) is a function well suited to characterize the printability of given features.[xi,xii,xiii]

[xi] M. D. Levenson, "The phase-shifting mask II: Imaging simulations and submicrometer resist exposures", IEEE Transactions on Electron Devices, Vol. 31 (6) 753–763 (1984)

[xii] C. A. Mack, "Understanding focus effects in submicron optical lithography", Proceedings SPIE Vol. 922, 135–148 (1988)

[xiii] H. Kirchauer, "Photolithography Simulation"PhD Dissertation at the Institue For Microelectronis of the Technical University of Vienna, 1998. (http://www.iue.tuwien.ac.at/publications/PhD%20Tjeses/Kirchauer/)

$$NILS = \frac{CD}{I_{maskEdge}}\left(\frac{dI}{dx}\right)_{maskedge} = CD * \left(\frac{d\ln I}{dx}\right)_{maskEdge} \quad (2)$$

Where, CD=Critical Dimension (Line width), I=Intensity, x=Length

However, due to the monotonic behavior of the optical intensity functions, both definitions are equivalent from the maximization point of view. More importantly, in real layouts there is no single value of CD, and the final mask after OPC will no longer be located at the original feature edge. By collecting the entire mask related information solely in the aerial image response, we can derive functions that can be extended to multiple exposures, arbitrary decomposition schemes, and are not coupled with the resist properties. In addition to this, a lithographic process that is centered at the threshold of the maximum log-slope delivers maximum exposure latitude. When optimization of the contrast (Equation 1) is conducted slightly out of focus, it also increases aerial image process window (the area below NILS/defocus curve), thus benefiting focus latitude as well[13].

Y. Granik, has shown in his work that neighboring edges contribute differently to the contrast and MEEF of a given edge, and that the strength of any individual effect depends on the optical system that is being used.[xiv,xv] Since the introduction of the additional features (i.e. SRAF or dipole masks) changes the optical environment, the effect of such additional features on the neighboring original edges is substantial.

[xiv] Y. Granik, N. Cobb, et. al. "Subresolution process windows and yield estimation technique based on detailed full-chip CD simulation" Proc. SPIE, Vol. 4182, 335–341 (2000).

[xv] Y. Granik, N. Cobb "MEEF as Matrix" Proc. SPIE, Vol. 4562, 980–991, (2001).

The determination of image contrast is a calculation very similar to that needed to determine EPE, and does not require significant additional computation time. Once the general optical conditions (λ, NA, illumination) have been determined for a given lithography system, the derivative of the image intensity can be easily calculated once the image of a layout has been simulated. Since it is very difficult to visualize every edge in a layout tool, aggregations of data can be conveniently presented in histograms, just as histograms of EPE can be used to evaluate pattern fidelity. The histogram represents the distribution of contrast values found throughout the image, with one "count" occurring for each contrast value (or ILS) uniquely assigned to each edge segment. This histogram corresponds to the optical signature of a particular layout under a predetermined set of optical conditions.

Figure 13:
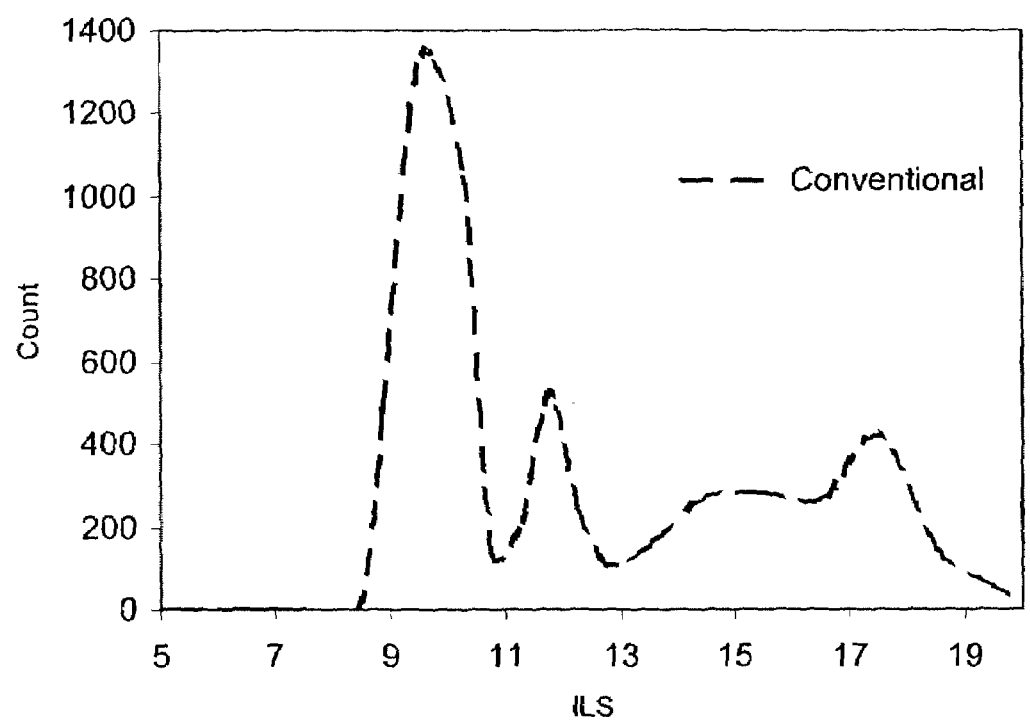
FIG. 13. Contrast Histogram. This distribution stores the behavior of a particular layout under a predetermined set of optical conditions. The objective of the method is to shift the distribution towards higher values of ILS.

FIG. 13 is an example of such a histogram. In this case, we are seeing the histogram for a large DRAM cell with more than 5200 optically different edges. At this point, no RET or OPC has been applied to the layout, meaning that this contrast distribution is a reference point for our subsequent simulations after the application of various RETs. It is important to mention, that the total number of segments in a histogram should be constant when evaluating the same layout. This conservation principle has been used consistently in all simulations performed.

Figure 14:
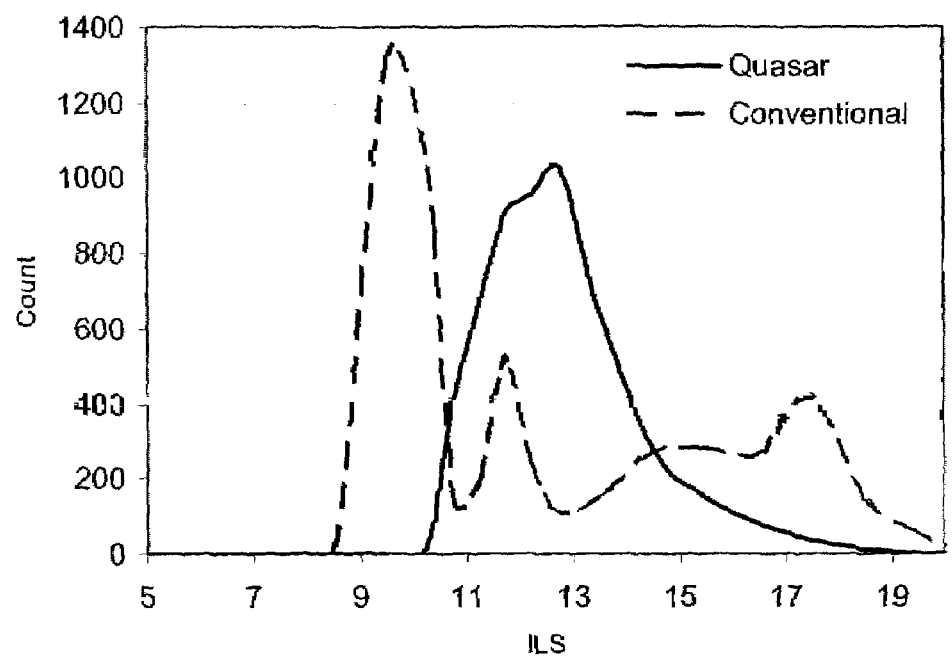
FIG. 14. Contrast-Distribution for two different illumination pupils. As expected, off-axis illumination settings such as Quasar™, improve the image contrast compared to a conventional illumination aperture FIG. 15. Cost Function $\Phi$ during opening angle optimization. Outer sigma=0.875 and inner sigma=0.05 were held constant during the optimization. The cost function is able to determine that the best opening angle from the image contrast perspective is 30°.

These original contrast values are a set of discrete bins with a resolution that can be varied—The finer the grid, the larger the number of bins (and the smaller the values of count are for each bin)—. The set of bins is denoted by $C_O$, and the counts associated with these values are denoted by $H_0 = f_O(C_O)$. We now make the layout manipulations that are required for the implementation of a particular RET recipe (e.g. adding SRAF, parsing for dipole illumination, etc.) After specific variations of the given RET have been added to the layout, a new image is simulated, new contrast values calculated for each edge, and a new global contrast distribution $H_{RET} = f_{RET}(C_O)$ is produced. An example of a histogram produced with the application of off-axis illumination for the same layout used in FIG. 13 is shown in FIG. 14.

It is clear that $H_{RET}$ can represent many things, depending on the RET conditions applied, and is a function dependent on many, many variables. There is therefore an actual family of histograms, $\{H^i_{RET}\}$ depending on a particular variable that is changed. However, for each RET, there are often a few key parameters. For example, when adding an SRAF, the spacing of the SRAF is a critical parameter that requires optimization. Likewise, for dipole illumination, the orthogonal edge bias becomes another key parameter to explore. Even optical parameters such as sigma and other pupil dependent quantities can be explored using this approach.

To apply our methodology, we compute $H_{RET}$ at various values of these parameters and look to maximize the number of segments that has a printable contrast. Unfortunately, there is not a simple definition of what is printable. This will always be process specific. We denote this threshold contrast value as $C_T$. For the examples presented here, we have generally used values of $C_T > 10$ representing healthy printability To actually optimize, a cost function Φ is generated as a function of the RET technique and the key parameter α under optimization. This represents the subtraction of suboptimal contrast counts from the number of counts at acceptable contrast.

$$\Phi(\alpha, C_o) = \sum_{C_i=C_T}^{C_i=C_{\max}} H_{RET}(\alpha, C_o, C_i) - \sum_{C_i=C_{\min}}^{C_i=C_T} H_{RET}(\alpha, C_o, C_i) \quad (3)$$

By maximizing this function, a more printable image is achieved.

This technique can be further adapted by the addition of a weighting function. Although maximization of Φ above will produce a higher contrast image, some edges with extremely low contrast may have low values of $H_{RET}$, but even a single failure in the wrong place can cause an IC to fail. To address this practical reality, a weighting function W can be introduced. W is multiplied with $H_{RET}$ to produce the final cost function $$\Phi(\alpha, C_o) = \sum_{C_i=C_T}^{C_i=C_{\max}} W(C_i) \cdot H_{RET}(\alpha, C_o, C_i) - \sum_{C_i=C_{\min}}^{C_i=C_T} W(C_i) \cdot H_{RET}(\alpha, C_o, C_i) \quad (4)$$

W can take any form. Typically, W can be high for values of low contrast and 1 for acceptable values. W can also be defined a parabola, centered on $C_T$. By selecting different W functional forms, it is possible to trade areas of high contrast with areas of very low contrast. Experimentation with various weighting functions that produce better wafer results is still an active area of investigation.

By proceeding in this fashion, the method now must consider local interactions between intersecting RET recipes. Once all optimal cases are simultaneously applied for every parameter α, it is required to verify that the local optimizations of different parameters do not combine to locally degrade contrast. More importantly, after maximizing contrast, there are very few locations that have the correct placement after imaging. In order to address the final pattern fidelity of the design, a model-based OPC treatment is used on those edges that have not been biased.

Once the model based OPC has finished, the resulting layout is evaluated to assess the improvement in overall contrast of the design. Whereas a direct model-based solution guarantees that the given layout will have an acceptable pattern fidelity, a combination of contrast optimization and model-based OPC returns the same level of confidence from the pattern fidelity point of view, plus the added advantage of a higher contrast layout less sensitive to dose and focus variations.

Off-Axis Illumination

As an initial illustration, we show a histogram distribution in FIG. 13 for an image of a DRAM cell under conventional illumination conditions: λ=248 nm, σ=0.875, and NA=0.7. Because the minimum line widths are at the border of resolution (k1=0.28 for this layout), contrast is unprintable (<10) for the majority of the edge segments.

By merely changing the illumination to off axis illumination, in this case a Quasar illumination system[xvi] with ($\sigma_{out}$=0.875, $\sigma_{in}$=0.65, and an opening angle of 30°. The simple addition of the RET has moved the entire distribution to higher contrast, making the image far more printable.

[xvi] J. Finders, A. M. Mulders, J. Krist, D. Flagello, P. Luehrmann, et. al "Sub-0.25 Micron Lithography Applying Illumination Pupil Filtering (Quadrupole) On a DUV Step & Repeat System"

Figure 15:
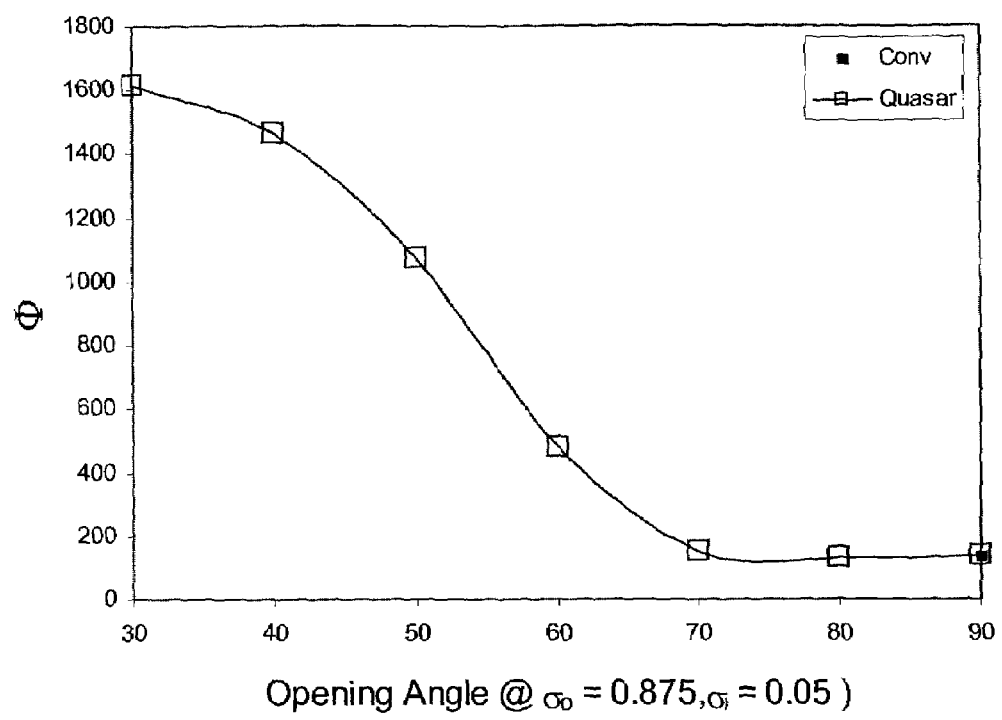
Figure 16:
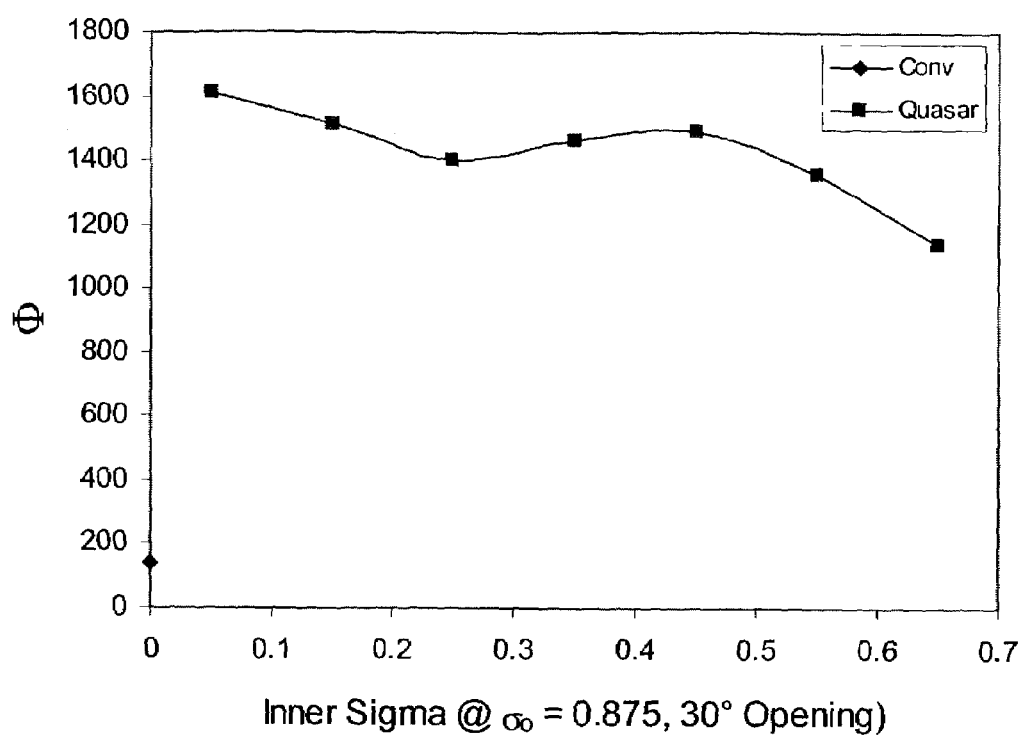
FIG. 16. Cost Function $\Phi$ during inner sigma optimization. Outer sigma=0.875 and opening angle=30° were held constant during the optimization. The cost function indicates that at higher values of inner sigma there is a lower image contrast for the particular design under investigation.

FIG. 15 shows how the cost function $\Phi$ can be used to determine the best opening angle for an off-axis illumination system, from the image contrast viewpoint. The value of $\Phi$ for the conventional case is included for reference. As expected, by reducing the opening angle, there are more high contrast edges, which are translated into a higher value for the cost function. FIG. 16 explores how the contrast changes by adjusting the inner sigma and keeping the opening at 30° and the outer sigma at 0.875. According to these results, the best illumination pupil will be a 30° Quasar illumination, with outer sigma of 0.875 and inner sigma of 0.05. There are more considerations for a robust process other than contrast, but this information suggests the range of settings that will provide adequate imaging from the contrast point of view.

Sub-Resolution Assist Features

Figure 17:
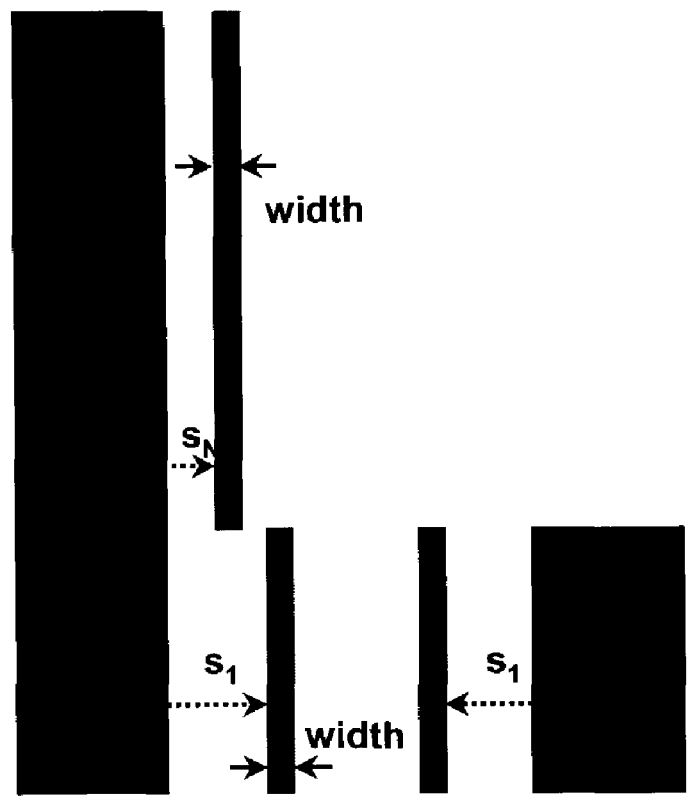
FIG. 17. Scattering Bar parameters. Scattering bar width and separation for optically different edges are calculated to improve depth of focus and feature contrast.

Sub resolution assist features (SRAF) have been used for some time as a rule-based technique for OPC that reduces iso-dense bias and increases contrast and process window.[xvii], [xviii] An illustration of a generic SRAF is shown in FIG. 17. As is clear from the diagram, there are several parameters that define the placement and application of even a simple SRAF. All the parameters that define an assist feature rule have unique advantages and limitations. One could vary all the SRAF parameters; however, mask manufacturing and inspection constraints define current limits to some of these values. Current mask manufacturing processes can control the width of individual SRAF across the full design, as long as the target width is constant, and the distance between bars depends on the pattern recognition capabilities of current inspection tools.

[xvii] J. F. Chen, T Laidig, K. E. Wampler, R Caldwell, "Practical method for full-chip optical proximity correction", Proc. SPIE V.3051, 790–803 (1997)
[xviii] J. F. Chen, T Laidig, K. E. Wampler, R Caldwell, et. al. "OPC technology road map to 0.14-um design rules", Proc. SPIE V. 3236, 382–396 (1997)

Our method is general enough to accommodate any geometric parameter and evaluate its optical performance as described in the previous section. For manufacturability reasons, it was decided that feature-to-SRAF spacing was in general the best parameter to optimize. This is because the SRAF width is often already at the minimum resolution that can be produced by the mask making process, and once the width of the SRAF is fixed, along with the inter-feature distances and minimum aspect ratio geometries, the SRAF separation is the only remaining parameter that can freely be chosen.

SRAF-to-main feature separation alters the contrast of the original edges without creating many problems during the mask manufacturing process so long as the separation lies within the current mask manufacturing and inspection constraints.

There are many considerations involved in the successful implementation of this method. It is important to remember that since the current methodology maximizes the global contrast of the layout, this approach will inevitably generate a few cases where the OPC recipe is not appropriate for specific topological cases. This design-dependent problem is explored in more detail elsewhere.[xix]

[xix] J. A. Torres, D. Chow, P. de Dood, D. J. Albers, "RET Compliant Cell Generation for sub-130 nm Processes", in Optical Microlithography XV, Proc. SPIE, Vol. 4691, in print (2002)

Figure 18:
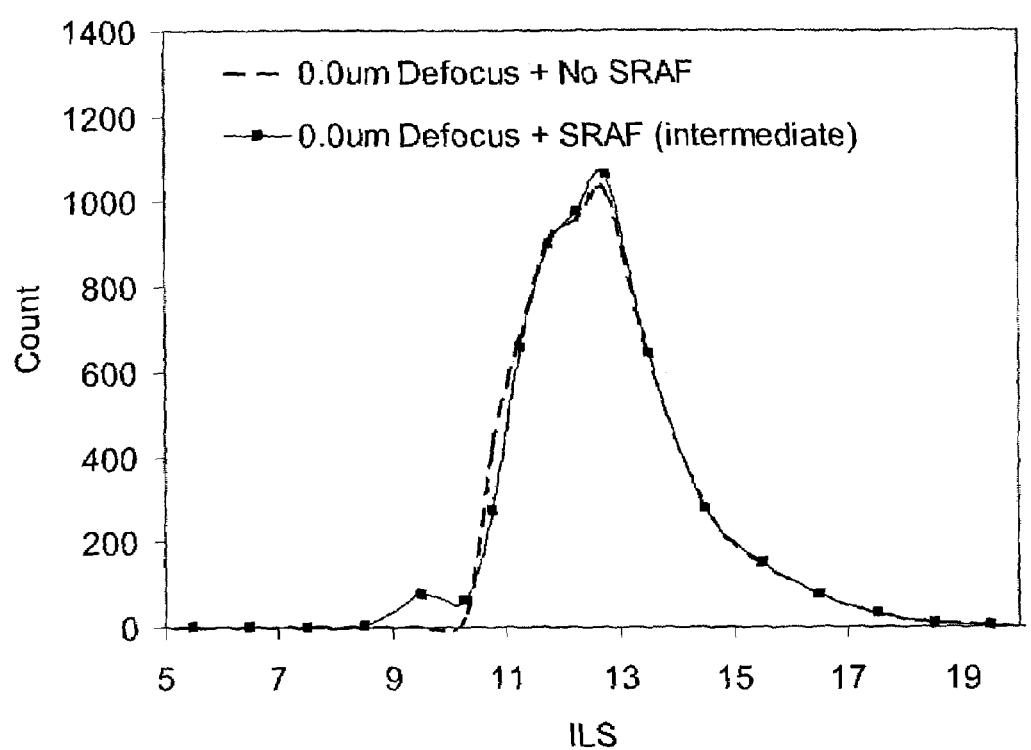
FIG. 18. Initial and intermediate contrast distributions. Scattering bar insertion can cause very low contrast regions.

FIG. 18 shows that the thoughtless application of SRAF by a simple rule can generate few cases with an even lower contrast value. Such cases are later translated in poor resolution regions where killer defects (such as bridging or pinching) can occur.

In order to reduce this problem, after the application of global rules for SRAF application, a local examination of the SRAF can expose the situations in which the SRAF maximizes the contrast of one edge but at the same time disturbs neighboring features. Once those cases are identified, a local clean up usually can correct the situation. There are two possible choices: Remove the SRAF completely or, adjust it locally.

Figure 19:
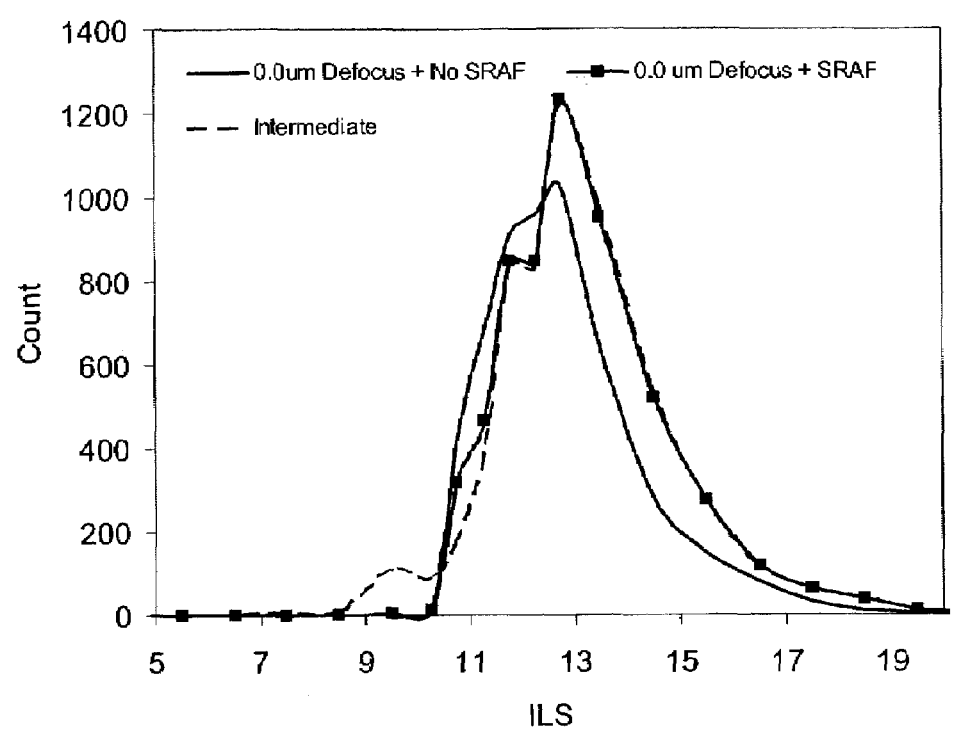
FIG. 19. Initial, intermediate and final contrast distributions. The very low contrast regions induced by scattering bars need to be adjusted (in this case erased all together) to prevent contrast degradation.

For reasons expressed at the beginning of this section, and because of the exploratory nature of this work, the bars that caused degradation of the local contrast are erased completely. After the bars that degrade locally neighboring edges are removed, a new contrast distribution is calculated and the impact on the removal of the SRAF quantified. This is shown in FIG. 19. FIG. 19 shows three different curves: the original contrast distribution (solid line), the distribution immediately after global optimization (dashed line with clear squares) and the final contrast distribution after local correction (solid line and solid squares). After final cleanup, there are no cases of lower-than-original-contrast edges. These regions have in fact been found previously[xx] and they depend on the set of optical conditions that are used.

Figure 20:
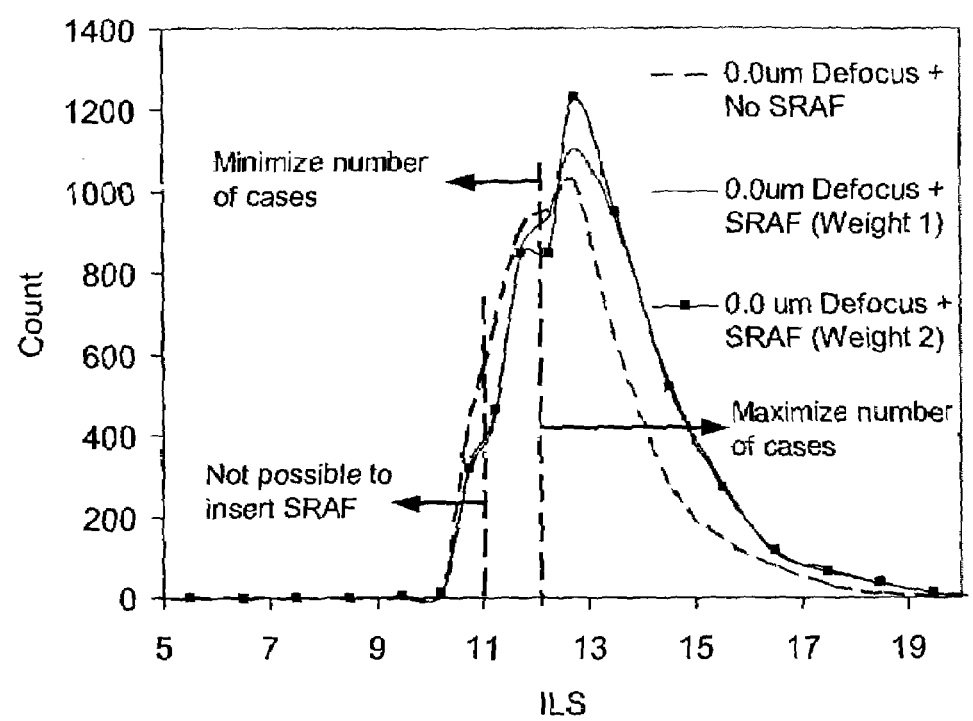
FIG. 20. Contrast distributions and weigh functions. The weigh function aids in trading high contrast edges for medium contrast edges in order to achieve a more homogeneous imaging.

[xx] R. Socha, et al. "Forbidden Pitches for 130 nm lithography and below", Proc. SPIE Vol.4000, 1140–1155 (2000), Up until now a constant weight function W=1 was used during the cost function evaluation. FIG. 20 compares a case where the weight function was altered to a function of the form:

$$W = -2.79 \cdot ILS + 30.854 \qquad (5)$$

$$[0, 11]$$

$$W = 1$$

$$(11, 13]$$

$$W = 2.55 \cdot ILS - 32.703$$

$$(13, \infty)$$

This way, the final solution is biased towards higher contrast values. Notice how the functional form of both distributions is essentially the same; only the peaks and valleys are slightly different. The distribution that results from using an improved weighing function is clearly better since it generates more high contrast edges. The addition of weights to the distributions is a global control of the allowed tradeoffs between low, nominal and high ILS values. Equation 5 weighs low-ILS values more (ILS from 0 to 11 are considered low in this example, but the range depends on the specific process requirements), which in turn returns a smaller cost ($\Phi$). The nominal ILS values—contained within the (ILS from 11 to 13 range)—are not weighed, and finally the large ILS range (ILS greater than 13) returns a bigger cost when the distribution is shifted toward larger ILS values. A lithographer may find these weights useful when determining the best form of the cost function ($\Phi$). By assigning different weights, it is possible to find equivalencies, for example: Tradeoff one two edges of ILS=30 if that move makes one edge with ILS=2 to increase to ILS=3. It is possible that a variable SRAF approach can prevent the degradation of the final global contrast distribution, but such an approach should only be explored if the image formation cannot be optimized by any other means (for example, re-tuning of the optical illumination conditions) or if mask manufacturing and inspection constraints are relaxed. However, it is encouraging finding that even with the removal of some SRAF, the class of higher contrast edges remains almost unchanged, and the class of lower contrast edges is not worse than the original.

The main objective of SRAF and many other Resolution Enhancement Techniques (RET) is to improve the process window of a particular design. So far we have focused on the importance of improving contrast. However, as FIG. 21 indicates, by maximizing contrast it is possible to increase the process window of the design without having to simulate a large set of different dose and focus conditions.

Figure 21:
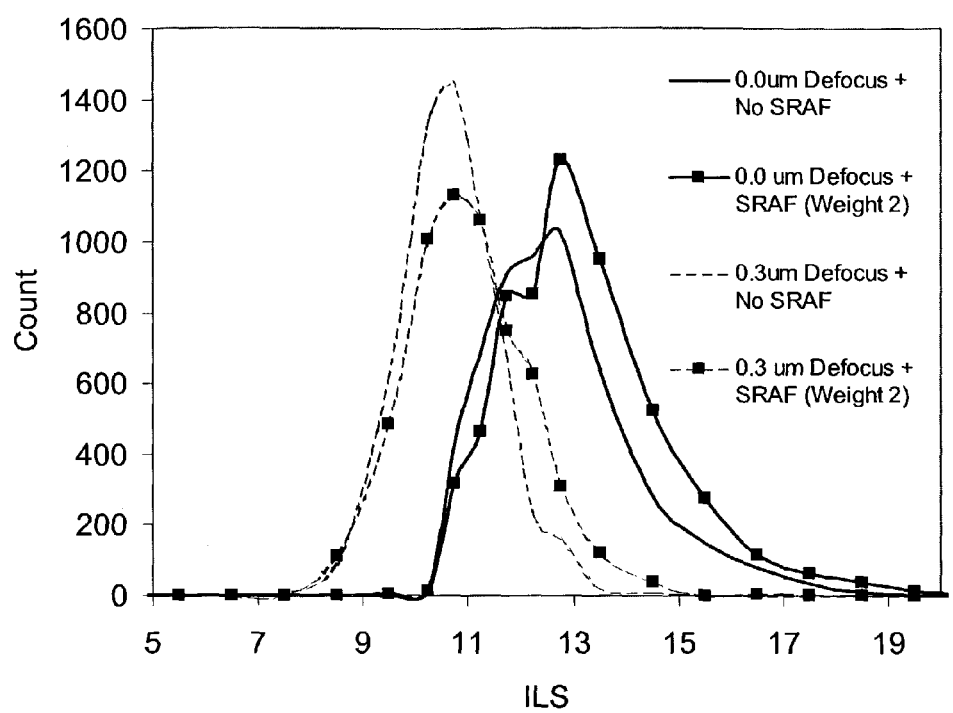
FIG. 21. Infocus and defocus evaluation. By improving contrast at best focus conditions, the contrast at out of focus conditions gets improved as well.

FIG. 21 shows 4 curves: The original contrast distribution at best focus (solid line), the final contrast distribution at best focus (solid line with square markers), the original layout with no OPC at 0.3 micron defocus (dashed lines) and the layout with the SRAF calculated from the in-focus case but simulated at 0.3 micron defocus (dashed lines and solid squares). This very simple method is able to increase the number of cases that can be found closer to higher contrast (and therefore more robust imaging) regions. Since some SRAF were completely removed, the out-of-focus distributions are very similar to each other at low contrast values.

Dipole Illumination

An RET that has recently been considered for the 65 nm node is dipole illumination. Although the resolution enhancement potential was originally recognized over 10 years ago,[xxi] it was quickly realized that double exposures would be required to make a complete image, in which vertical lines are printed with a horizontal dipole and horizontal lines are printed with a vertical dipole.[xxii] Dipole was abandoned for more generally applicable, single exposure techniques like model-based OPC.

[xxi] S. Asai, I. Hanyu, and K. Hikosaka, "Improving projection lithography image illumination by using sources far from the optical axis", J. Vac. Sci Technol B9 2788–2791 (1991).

[xxii] S. Asai, I. Hanyu, and K. Hikosaka, "High performance optical lithography using a separated light source", J. Vac. Sci Technol B10 3023–3026 (1991).

Figure 22:
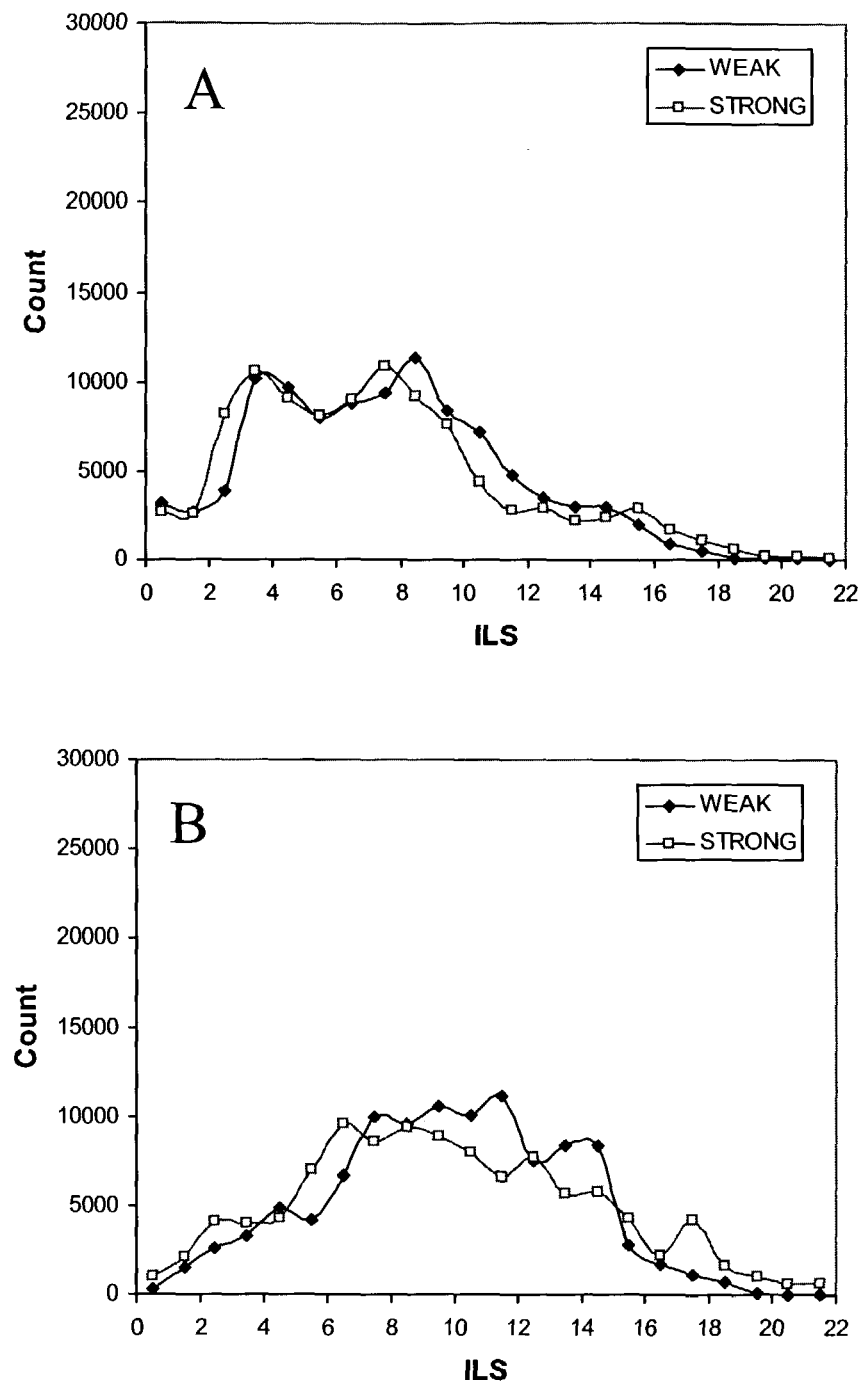
FIG. 22. Initial Contrast Distributions.

With the push to smaller wavelengths, the topic of dipole illumination has been reopened. The key problem remains, however, the decomposition of an arbitrary layout into two masks, one for a vertical dipole and one for a horizontal dipole. Our contrast optimization technique has been found to be extremely helpful for determining the efficacy of various decomposition recipes. In the case of a double exposure dipole (FIG. 22) there are two distinctive optical signatures, one related to each dipole orientations. The notion of vertical and horizontal features is generalized to the low and high contrast regions under a particular set of illumination conditions. The ILS that defines a low or high contrast edge is a free optimization variable. For the purposes of this work, we have—by inspection—determined the range that contains the majority of edges (FIGS. 22A and 22B). For FIG. 22A the majority of edges are contained in the ILS=[3,10] range. FIG. 22B suggests that the majority of the edges are within ILS=[6,15]. The range that results from the sum of both ranges (3,15), creates the set of candidates for the ILS value that will be used to decide if a feature has low or high contrast and therefore in which mask it should be controlled. We have arbitrarily chosen an ILS=10 since it is located in the upper half portion of the range, but further optimization may be needed in order to define the best ILS value to make such edge selection.

To illustrate the application of our method here, two optical conditions were chosen as an example: a strong dipole and a weak dipole. All simulations were carried out using stepper conditions $\lambda$=248 nm and NA=0.7 NA. The dipole illumination setting has $\sigma_{out}$=0.875 with a 35° segment opening. The strong dipole had a $\sigma_{inner}$=0.6 and the weak dipole had $\sigma_{inner}$=0.35. As shown in FIG. 22, certain edges exhibit low or high contrast depending on the rotation of the dipole element. By looking at the distributions it is possible to determine that the design is mostly oriented on the horizontal direction. When the design is exposed by a horizontal dipole, the contrast distributions are shifted toward lower values. When the same system is exposed under a vertical dipole, the distributions shift towards higher contrast values. This behavior is controlled, among other things, by the inner sigma of the illuminator. Strong dipole conditions (low inner sigma) enhance the effect previously described.

Figure 23:
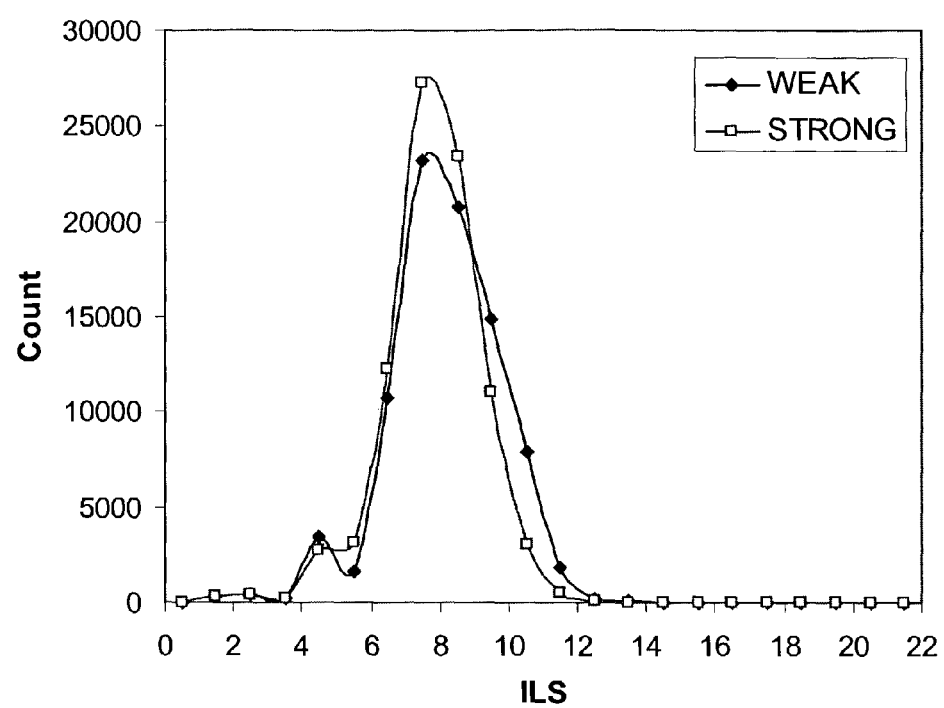
FIG. 23. Initial Double Exposure Contrast Distribution. These distributions are used as reference to the consecutive contrast enhancements that the method proposes. Such a step is necessary to minimize the number of local low contrast cases that a global optimization may suggest.

However, a dipole method requires two exposures, which means that if no protections are defined between exposures, there is a reduction of the final contrast value that a given design may attain. FIG. 23 is the lower limit of the method. Only one mask is used for both exposures. Under weak dipole conditions the distribution is slightly shifted toward higher contrast values with respect to the strong dipole case. This has to do with the strong proximity and $0^{th}$ order light that degrade the final pattern during the non-optimal exposure step. The successive improvement in contrast is compared to this limiting case in order to prevent situations where the method proposes a solution that may very well improve the global contrast, but can locally generate low contrast regions that translate in possible sites for line pinching or bridging defects.

Figure 24:
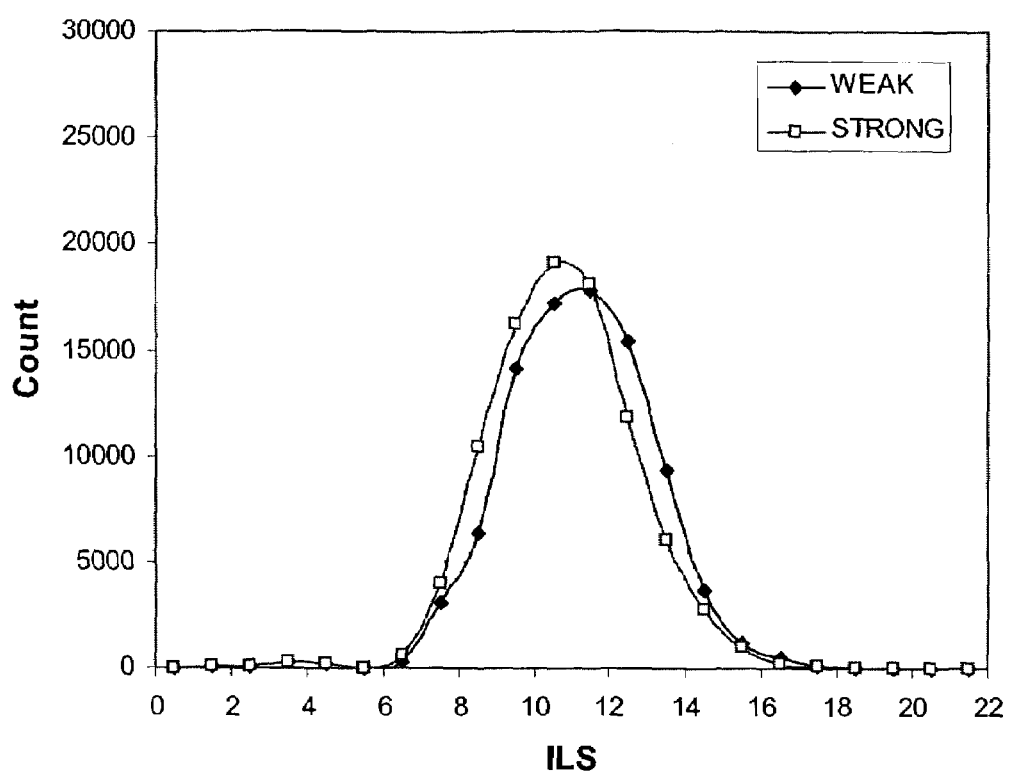
FIG. 24. Contrast Distribution after Model Based OPC has been applied to sub-optimal initial masks. Normally strong dipole conditions provide a better pattern resolution, but they also introduce strong proximity effects. These proximity effects are responsible for the loss of contrast in the strong dipole case, which in turn causes the weak dipole illumination system to improve (shifted towards high contrast values).

A double exposure model-based OPC requires three layers as input: A target layer that corresponds to the intended design, and one layer for each exposure. By manipulating the edges present in both masks the method converges to a solution that attains the correct pattern fidelity specified by the target layer. There are many possible solutions to the problem, especially when the design needs to be split into two or more exposures. It is possible in principle to feed the original design three times to the model-based OPC method (as the target design, and as the first and second exposure masks). The method will converge to a solution that returns acceptable pattern fidelity for that specific set of conditions. FIG. 24 shows the final contrast distributions after this approach has been used. Both distributions are shifted towards higher contrast values with respect to the lower limiting case presented in FIG. 23. FIG. 24 shows the distributions that the contrast-based method will now use as reference for improvement.

Figure 25:
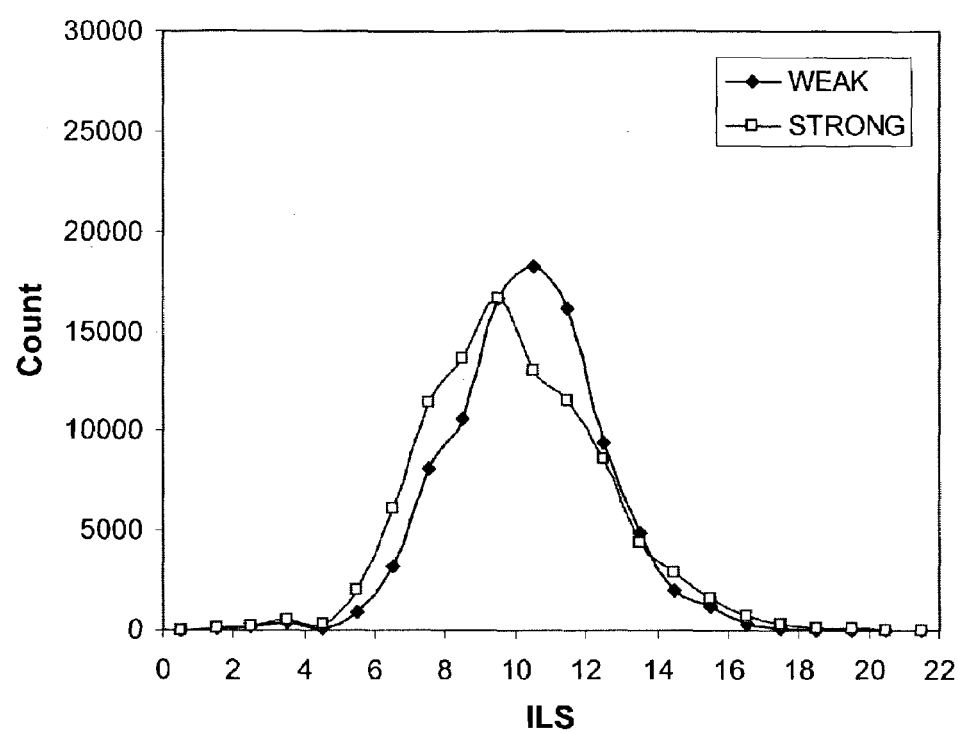
FIG. 25. Contrast Distribution of Initial Masks Generated by the Contrast Assisted Dipole Decomposition. These are raw results that do not necessarily meet the pattern resolution criterion. Such a set of masks is used as the initial conditions for a subsequent model-based OPC.

After following the steps described in the previous section, the resulting layouts from the contrast-assisted decomposition are evaluated to determine the new contrast distribution. The spread of such distributions, as long as the spread occurs toward higher contrast values, is not undesirable. FIG. 25 shows the contrast distributions for the weak and strong dipole conditions. These masks layouts are later fed to a model based OPC. Only the edges that have not previously received a bias are allowed to move during the method. By doing this, the convergence criterion is forced to follow a different path in the solution space and arrive at a different answer that achieves the target pattern fidelity and improves the global contrast of the design at the same time.

Figure 26:
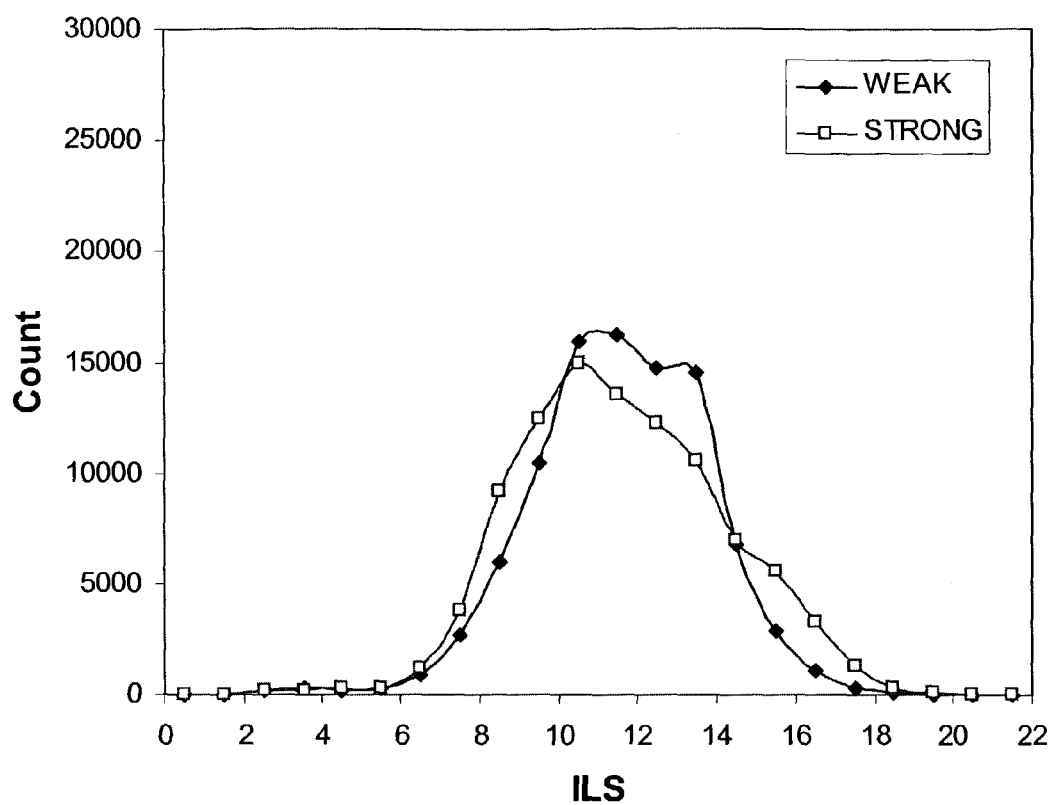
FIG. 26. Contrast Distribution of Final Masks from the Contrast Based Dipole Decomposition followed by Model Based OPC. From these distributions it is difficult to determine which system will respond better to process variations. While the result from strong dipole conditions has placed more edges in the high contrast category, it has also produced more edges in the lower contrast regions than its weak dipole counterpart.

The final contrast distributions that result from the contrast assisted decomposition and the model-based OPC, are not necessarily narrower than the distributions obtained from applying model-based OPC to a sub-optimal initial set of masks. Since this is not a critical dimension (CD) distribution, the spreading of the distributions towards higher values of contrast is in fact more desirable than a narrow contrast distribution centered on a lower contrast region. FIG. 26 shows the contrast distributions that result from the combined use of a model assisted decomposition and a model based OPC.

Figure 27:
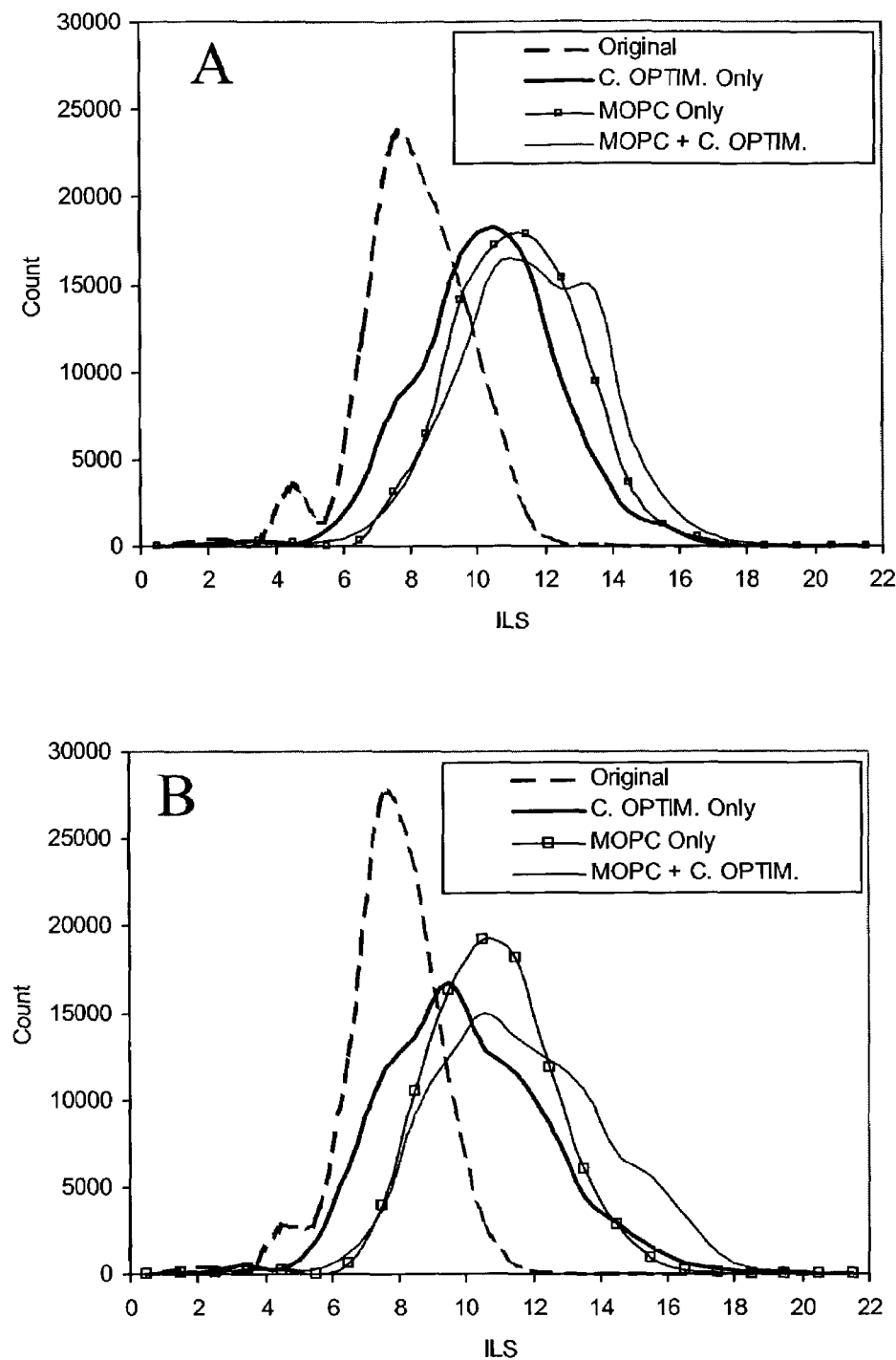
FIG. 27. Successive Shift toward Higher Contrast Regions.

FIG. 27 shows the incremental shift of the final contrast distributions for two systems: 15A for weak dipole conditions and 15B for strong dipole conditions. When no special processing has been performed on the original design, it is possible to calculate the lower limiting case (dashed lines). When this set of masks is passed to the model-based OPC, new masks are generated. New distributions can be calculated from this new set of masks (light lines with square markers). This intermediate solution has improved the contrast and meets the pattern fidelity criterion. However, in order to improve further the contrast of the final result, one needs to start from a different set of masks. In this method, that other set of masks is the result of the contrast-assisted decomposition. Such masks have distributions (dark continuous line) that have already shifted to higher contrast values as determined by the method. These masks very likely do not meet the pattern fidelity constraints. Because of that, they are only used as initial conditions for the model-based OPC correction. Once this final model-based OPC has been applied to the masks generated by the contrast-assisted method; a new distribution, generally better than all previously calculated cases, is obtained (light continuous line).

In principle, by maximizing the contrast of a given layout, it is possible to obtain a solution that will be less sensitive to defocus and dose variations. In the end, the goal is to improve the overall process window of a particular design.

Figure 28:
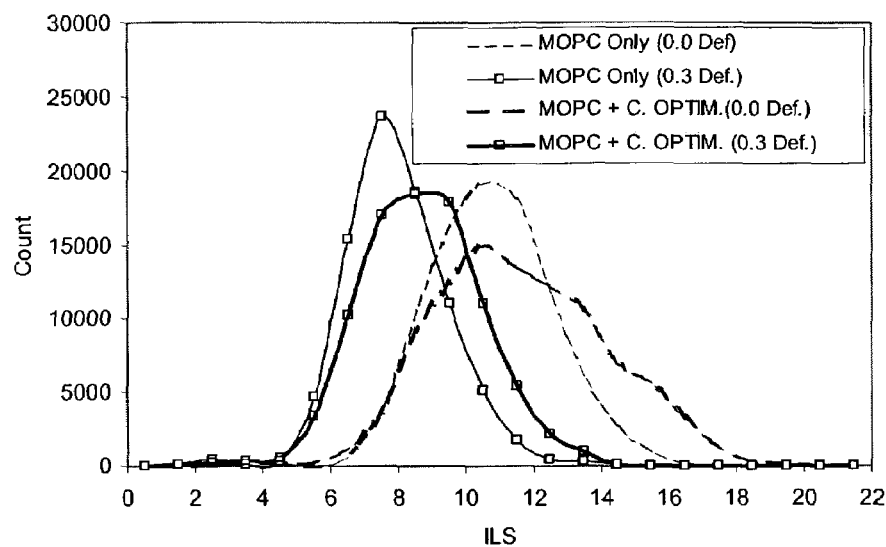
FIG. 28. Contrast Distribution Shift due to Defocus Conditions for: A) Strong Dipole Illumination. B) Weak Dipole Illumination.
Figure 28:
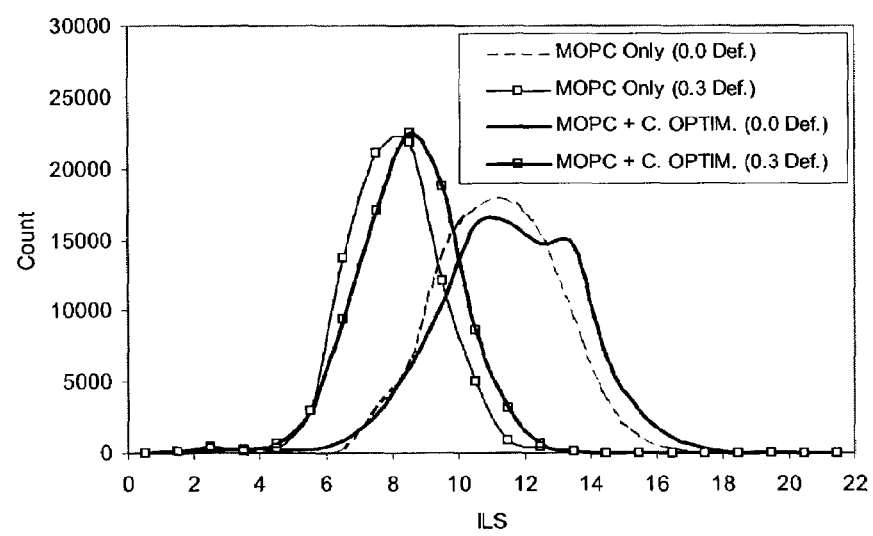

FIG. 28 shows how the solution calculated at best focus responds with varying focus. The light lines highlight the system that was not subject to dipole decomposition, while the dark lines indicate the distributions for the set of masks that received a contrast-assisted decomposition. It is expected that the best method should prevent large variations of contrast for every edge in the design. FIG. 28A shows that for the strong dipole condition, the contrast-based method does not shift as far as in the case where no special decomposition was used. At the same time, the area defined by the overlap between the distributions calculated at different focus conditions is larger and centered towards higher values of contrast when the contrast-assisted decomposition is used.

At weak dipole conditions the behavior is similar, although not as clear as when strong dipole conditions are used. The contrast distributions capture effectively the increments in the process window of a particular design. Even these seemly small changes in the contrast behavior of the layout can make the difference between acceptable and non-acceptable lithographic conditions.

Pattern fidelity is difficult to account for. Traditionally, one dimensional process windows have been used to rank the feasibility of a particular process. However, such metrics do not necessarily capture the two-dimensional aspects present in any real design. A statistical evaluation of the patterns can be performed as described in detail elsewhere[xxiii]. In this case we have decided to select a specific region of the design under study and simulate its optical behavior at two foci conditions and three different reduced threshold values (0.18, 0.20, 0.22).

[xxiii] L. Capodieci, J. A. Torres, et. al. "Effects of advanced illumination schemes on design manufacturability and interactions with optical proximity corrections". Proc. SPIE Vol. 4181, 58–60 (2001)

Figure 29:
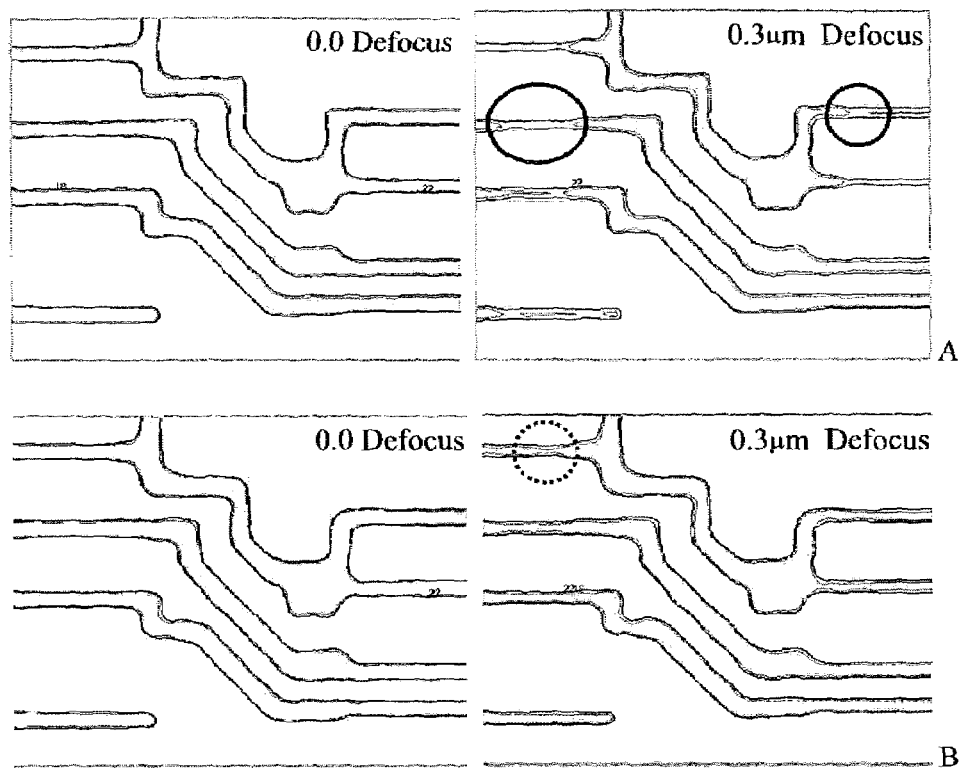
FIG. 29. Pattern Fidelity Change due to Defocus and Dose for Strong Dipole Illumination: A) No Contrast-Assisted Method. B) Contrast-Assisted Method.

The area of simulation depicted in FIG. 29, indicates that at zero defocus conditions the system has perfect pattern fidelity, including 45° angles and low aspect ratio segments. However, when the conditions are other than the ones used for simulation (e.g. at 0.3 $\mu$m defocus), different killer defects can be found. The circles highlight regions at which there has been strong pattern fidelity degradation.

The solution from the contrast-assisted decomposition method behaves in a much better fashion than when the contrast-assisted solution is subject to the same threshold (dose) and focus variations. When the pattern fidelity is maintained in almost all regions—the variations highlighted in FIG. 29B (at 0.3 microns defocus) are not as large as in the previously described case—the method can further be improved by including additional features that can minimize the apparent iso-dense bias. While sub-resolution assist features were not used in this case, they can be added to the mask following the same contrast enhancement criteria used to determine the optimal bias values. It is also important to mention that at the end of this process, all the regions that present problems are already identified, reducing the number of edges that need to be inspected and fixed later on.

The method proposed here maximizes the local contrast for every edge, as defined by the image log-slope (ILS). While we believe that this metric captures the essential behavior related to image local contrast, there is no data that suggests that similar results cannot be achieved or improved by different local contrast-related functional forms.

The result of this initial work is encouraging. By classifying edges based on image log slope, it is possible to generate rules that in general improve the local contrast of the pattern being imaged. Furthermore, we have also provided evidence that local contrast and depth of focus are directly related, and that by improving ILS it is possible to improve the depth of focus. This result is particularly important since it allows RET rule optimization under a fixed set of optical conditions. This finding has an important impact on the number of simulations and experiments needed to identify an optimal RET approach that guarantees a stable process under focus variations.

Aberration and overlay sensitivity performance are still questions open for a more detailed analysis. Such questions can be answered via simulation, but an experimental validation is preferred in order to determine the actual performance of the method under real conditions. Initial simulations however, present encouraging results for the adoption of dipole masks for sub 100 nm imaging.

The data indicates that designs that contain 45° features can also be successfully imaged using this approach.

A complete and integrated approach can accept further restrictions, since the method can often be misused to generate acceptable RET recipes from the local contrast point of view, but completely unacceptable results from the pattern fidelity viewpoint. If mask-manufacturing constraints can be relaxed, the current approach is able to further adjust other geometric parameters that define a complete RET recipe. It is possible to do so as long as the changes do not become first order.

What is claimed is:

1. A method comprising:
   receiving a plurality of edge fragments that define at least a portion of a photolithographic design, said edge fragments having a tag classification selected from a plurality of tag classifications that define a contrast of the corresponding edge fragment;

applying a resolution enhancement to one or more of the edge fragments based on the tag classification to introduce an additional feature in the photolithographic design in order to change the contrast of the one or more edge fragments, wherein said resolution enhancements are applied by generating an original contrast signature for the plurality of edge fragments prior to modifying any of the plurality of edge fragments with the resolution enhancement;

selecting one of the plurality of tag classifications as a selected tag classification;

modifying each edge fragment among the plurality of edge fragments having the selected tag classification with the resolution enhancement;

generating a current contrast signature for the plurality of edge fragments after applying the resolution enhancement; and determining a signature change between the original contrast signature and the current contrast signature.

2. The method of claim 1 wherein the resolution enhancement comprises one of a plurality of resolution enhancements, and wherein applying the resolution enhancement further comprises:

selecting each of the plurality of resolution enhancements one at a time as a selected resolution enhancement; and for each of the selected resolution enhancements, repeating the modifying, generating a current contrast signature, and determining a signature change.

3. The method of claim 2 wherein the plurality of resolution enhancements comprise at least one of a distance for a sub-resolution assist feature (SRAF), a number of SRAFs, and a width of an SRAF.

4. The method of claim 2 wherein the plurality of resolution enhancements comprise at least one extension size for a shield in a trim mask.

5. The method of claim 2 wherein the plurality of resolution enhancements comprise at least one extension size for a shield.

6. The method of claim 1 wherein applying the resolution enhancement further comprises:

selecting each of the plurality of tag classifications one at a time as a selected tag classification; and for each of the selected tag classifications, repeating the modifying, generating a current contrast signature, and determining a signature change.

7. The method of claim 1 wherein the signature change comprises one of a plurality of signature changes, each of the plurality of signature changes corresponding to a particular resolution enhancement applied to edge fragments of a particular tag classification, and wherein applying the resolution enhancement further comprises:

for each tag classification, identifying a best signature change, each best signature change corresponding to a best resolution enhancement applied to edge fragments of a best tag classification;

prioritizing the best signature changes into a priority order from most contrast improvement to least contrast improvement; and modifying edge fragments corresponding to particular best tag classifications with respective best resolution enhancements in the priority order.

8. The method of claim 7 further comprising:

comparing an enhanced contrast to an original contrast for each of the plurality of edge fragments; and removing resolution enhancements from edge fragments for which the enhanced contrast is worse than the original contrast.

9. The method of claim 7 further comprising:

comparing an enhanced contrast to an original contrast for each of the plurality of edge fragments;

forming a subset of the plurality of edge fragments comprising edge fragments for which the enhanced contrast is worse than the original contrast;

generating a new original contrast signature for the subset of edge fragments; and repeating the modifying, generating a current contrast signature, and determining a signature change for each of a new plurality of resolution enhancements and each of the plurality of tag classifications.

10. The method of claim 7 wherein a best signature change comprises a largest increase of edge fragments having a contrast over a target contrast and with a smallest resolution enhancement.

11. The method of claim 1 further comprising tagging the edge fragments with one of the plurality of tag classifications that define a contrast by:

identifying a simulation site in each of the plurality of edge fragments;

calculating an intensity profile along a perpendicular cut line at each simulation site;

determining a maximum slope of the intensity profile, said maximum slope comprising an image log scale (ILS) for a respective edge fragment, and said ILS corresponding to a contrast of the respective edge fragment; and tagging each of the plurality of edge fragments with one of the plurality of tag classifications corresponding to a respective ILS.

12. The method of claim 1 wherein applying the resolution enhancement to the edge fragment comprises:

inserting one or more sub-resolution assist features (SRAFs) in the photolithographic design for the edge fragment.

13. The method of claim 1 wherein applying the resolution enhancement to the edge fragment comprises:

assigning the edge fragment to a phase shift mask; and creating a shield for the edge fragment in a trim mask.

14. The method of claim 1 wherein applying the resolution enhancement to the edge fragment comprises:

assigning the edge fragment to either a horizontal dipole mask or a vertical dipole mask; and creating a shield for the edge fragment in an opposite mask to which the edge fragment is assigned.

15. The method of claim 14 wherein assigning the edge fragment comprises:

determining a first contrast for the edge fragment using a horizontal dipole illumination;

determining a second contrast for the edge fragment using a vertical dipole illumination;

assigning the edge fragment to the vertical dipole mask if the first contrast is larger; and assigning the edge fragment to the horizontal dipole mask if the second contrast is larger.

16. The method of claim 1 wherein the original contrast signature corresponds to a first dipole illumination orientation, and the method further comprises:

repeating the method for a second dipole illumination orientation.

17. The method of claim 1 further comprising:
applying model-based optical proximity correction (OPC) to the edge fragment following application of the resolution enhancement.

18. The method of claim 1 wherein
generating the original contrast signature comprises:
  counting a first set of numbers of edge fragments in each of the plurality of tag classifications prior to modifying any of the plurality of edge fragments; and
  forming a first histogram of edge fragments versus contrast based on the first set of numbers; and
generating the current contrast signature comprises:
  determining a new contrast for each of the plurality of edge fragments;
  retagging each of the plurality of edge fragments to one of the plurality of tag classifications based on the new contrasts determined;
  counting a second set of numbers of edge fragments in each of the plurality of tag classifications after retagging; and
  forming a second histogram of edge fragments versus contrast based on the second set of numbers.

19. The method of claim 1 wherein determining the signature change comprises:
  determining a target contrast for the photolithographic design;
  calculating a first number of edge fragments in the original contrast signature that meet or exceed the target contrast;
  calculating a second number of edge fragments in the current contrast signature that meet or exceed the target contrast; and
  calculating the signature change as a difference in the first number and the second number.

20. The method of claim 19 wherein the second number is weighted by a weight function to emphasize at least one of large contrast increases and large contrast decreases.

21. A machine-readable media having stored thereon machine-executable instructions that when executed by a computer cause the computer to perform the method of claim 1.

* * * * *